(12) United States Patent
Lee et al.

(10) Patent No.: US 9,318,566 B2
(45) Date of Patent: Apr. 19, 2016

(54) METHOD OF FABRICATING SEMICONDUCTOR DEVICE HAVING GROOVED SOURCE CONTACT REGION

(71) Applicant: Samsung Electronics Co., Ltd., Suwon-si (KR)

(72) Inventors: Suk-Kyun Lee, Yongin-si (KR); Eung-Kyu Lee, Seoul (KR)

(73) Assignee: SAMSUNG ELECTRONICS CO., Ltd. (KR)

( * ) Notice: Subject to any disclaimer, the term of this patent is extended or adjusted under 35 U.S.C. 154(b) by 4 days.

(21) Appl. No.: 14/159,940

(22) Filed: Jan. 21, 2014

(65) Prior Publication Data

US 2014/0295632 A1    Oct. 2, 2014

(30) Foreign Application Priority Data

Mar. 27, 2013  (KR) .................. 10-2013-0032818

(51) Int. Cl.
| | |
|---|---|
| H01L 21/336 | (2006.01) |
| H01L 29/40 | (2006.01) |
| H01L 29/417 | (2006.01) |
| H01L 29/66 | (2006.01) |
| H01L 29/78 | (2006.01) |
| H01L 29/423 | (2006.01) |
| H01L 29/45 | (2006.01) |
| H01L 29/08 | (2006.01) |

(52) U.S. Cl.
CPC ........ *H01L 29/407* (2013.01); *H01L 29/41766* (2013.01); *H01L 29/66727* (2013.01); *H01L 29/7811* (2013.01); *H01L 29/7813* (2013.01); *H01L 29/0869* (2013.01); *H01L 29/0878* (2013.01); *H01L 29/42356* (2013.01); *H01L 29/42368* (2013.01); *H01L 29/42376* (2013.01); *H01L 29/456* (2013.01)

(58) Field of Classification Search
USPC .................................. 257/330, 334; 438/270
See application file for complete search history.

(56) References Cited

U.S. PATENT DOCUMENTS

| | | | |
|---|---|---|---|
| 5,998,833 | A | 12/1999 | Baliga |
| 6,445,035 | B1 | 9/2002 | Zeng et al. |
| 7,446,374 | B2 | 11/2008 | Thorup et al. |
| 7,504,306 | B2 | 3/2009 | Sapp et al. |
| 7,633,119 | B2 | 12/2009 | Bhalla et al. |
| 7,732,842 | B2 | 6/2010 | Session |
| 7,807,576 | B2 | 10/2010 | Pan |
| 7,952,141 | B2 | 5/2011 | Dunn et al. |
| 8,034,682 | B2 | 10/2011 | Herrick et al. |
| 8,053,315 | B2 | 11/2011 | Tai et al. |
| 8,278,702 | B2 | 10/2012 | Pan et al. |

(Continued)

FOREIGN PATENT DOCUMENTS

| | | |
|---|---|---|
| JP | 2010129973 | 6/2010 |
| JP | 2012049499 | 3/2012 |

(Continued)

*Primary Examiner* — Errol Fernandes
(74) *Attorney, Agent, or Firm* — Onello & Mello LLP

(57) ABSTRACT

In a method of fabricating a semiconductor device, a channel layer is formed on a substrate, and trench patterns are formed in the channel layer. Impurity bodies are formed in the channel layer between the trench patterns, and grooves are formed between the trench patterns in the impurity bodies formed in the channel layer. Source isolation regions are formed in the impurity bodies at bottom portions of the grooves, and source regions are formed in the impurity bodies at sidewall portions of the grooves.

20 Claims, 35 Drawing Sheets

(56) References Cited

U.S. PATENT DOCUMENTS

| | | | |
|---|---|---|---|
| 2007/0221952 A1* | 9/2007 | Thorup | H01L 29/7813 257/155 |
| 2010/0065904 A1 | 3/2010 | Pan et al. | |
| 2010/0099230 A1* | 4/2010 | Tai et al. | 438/270 |
| 2010/0140689 A1 | 6/2010 | Yedinak et al. | |
| 2011/0018059 A1* | 1/2011 | Dunn et al. | 257/334 |
| 2011/0210406 A1 | 9/2011 | Terrill et al. | |
| 2011/0233667 A1* | 9/2011 | Tai et al. | 257/334 |
| 2011/0254088 A1 | 10/2011 | Darwish et al. | |
| 2012/0025874 A1 | 2/2012 | Saikaki et al. | |
| 2012/0037983 A1* | 2/2012 | Hshieh | 257/334 |
| 2012/0058615 A1 | 3/2012 | Marchant et al. | |
| 2013/0026563 A1 | 1/2013 | Pan et al. | |

FOREIGN PATENT DOCUMENTS

| | | |
|---|---|---|
| KR | 2010032321 | 3/2010 |
| KR | 2011018510 | 2/2011 |

* cited by examiner

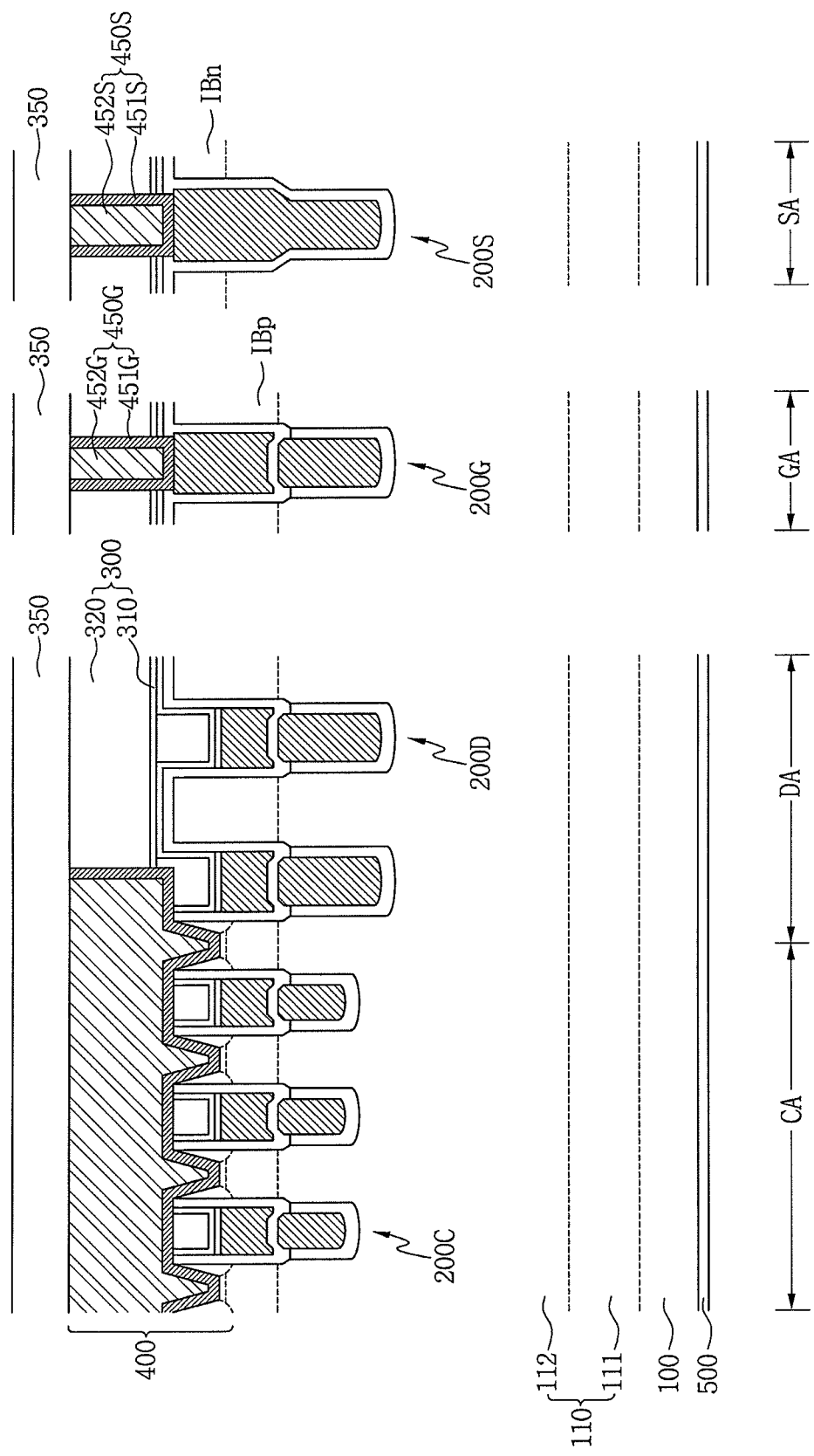

FIG. 2B
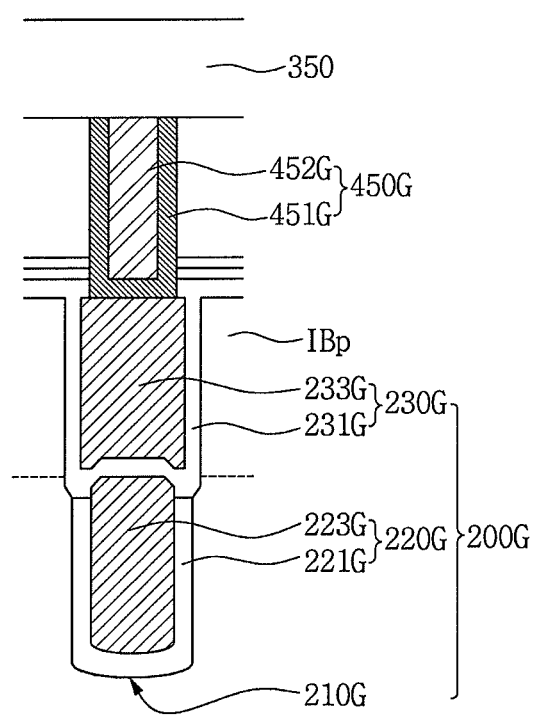
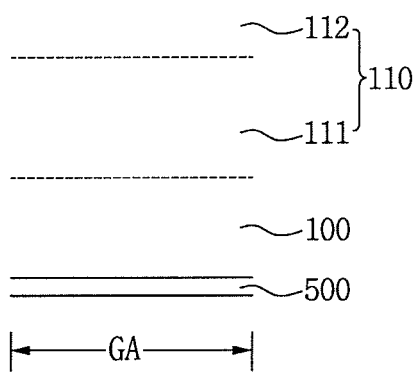

FIG. 2C
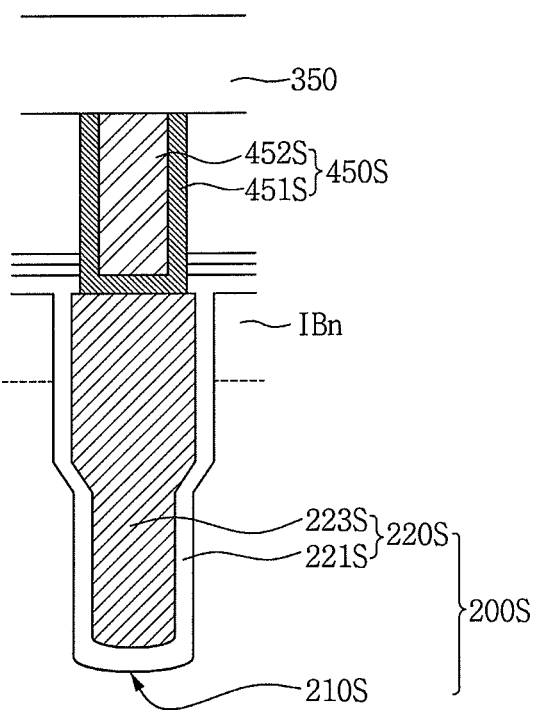
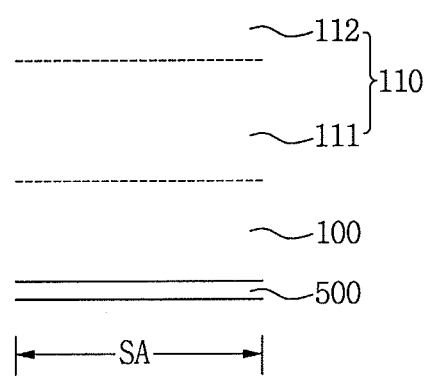

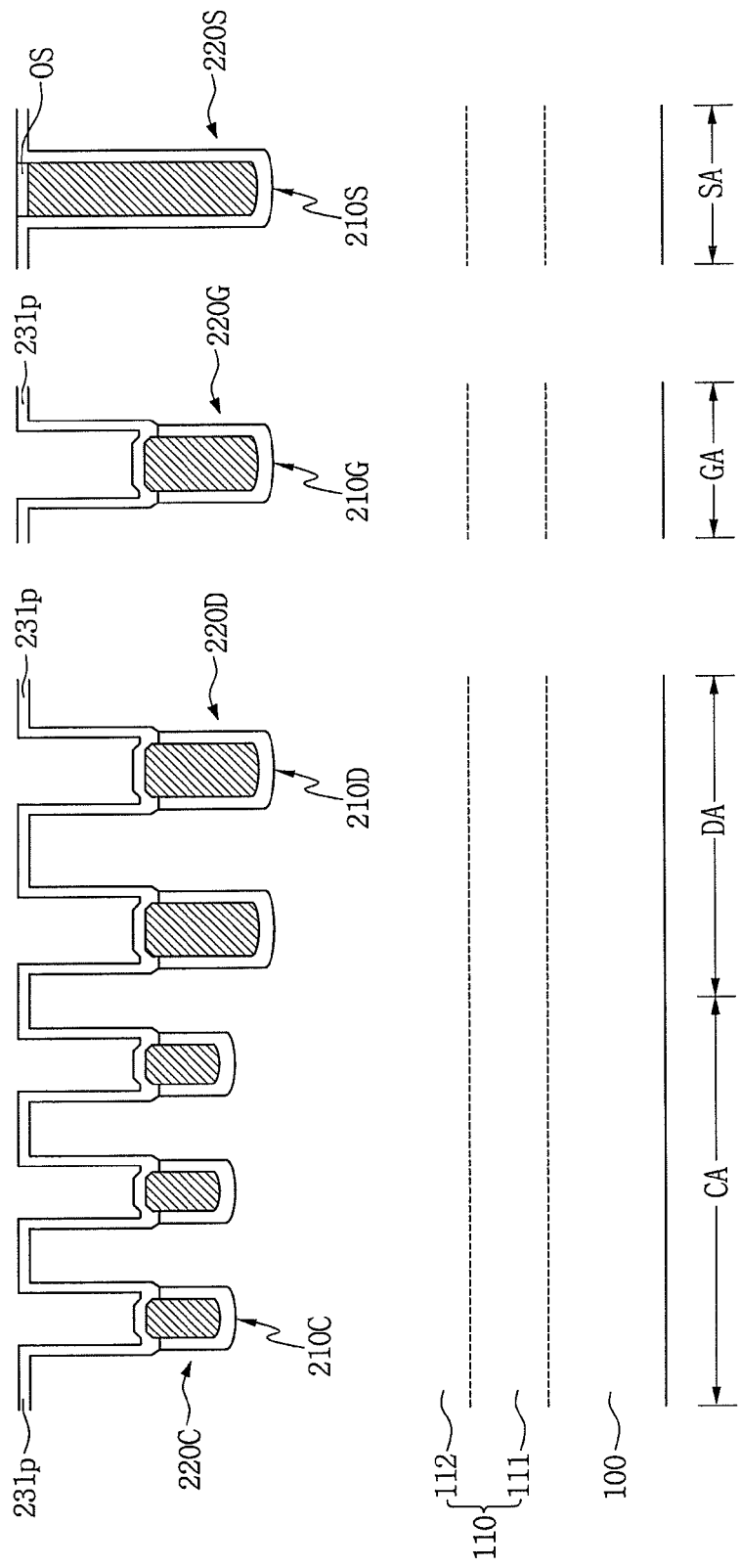

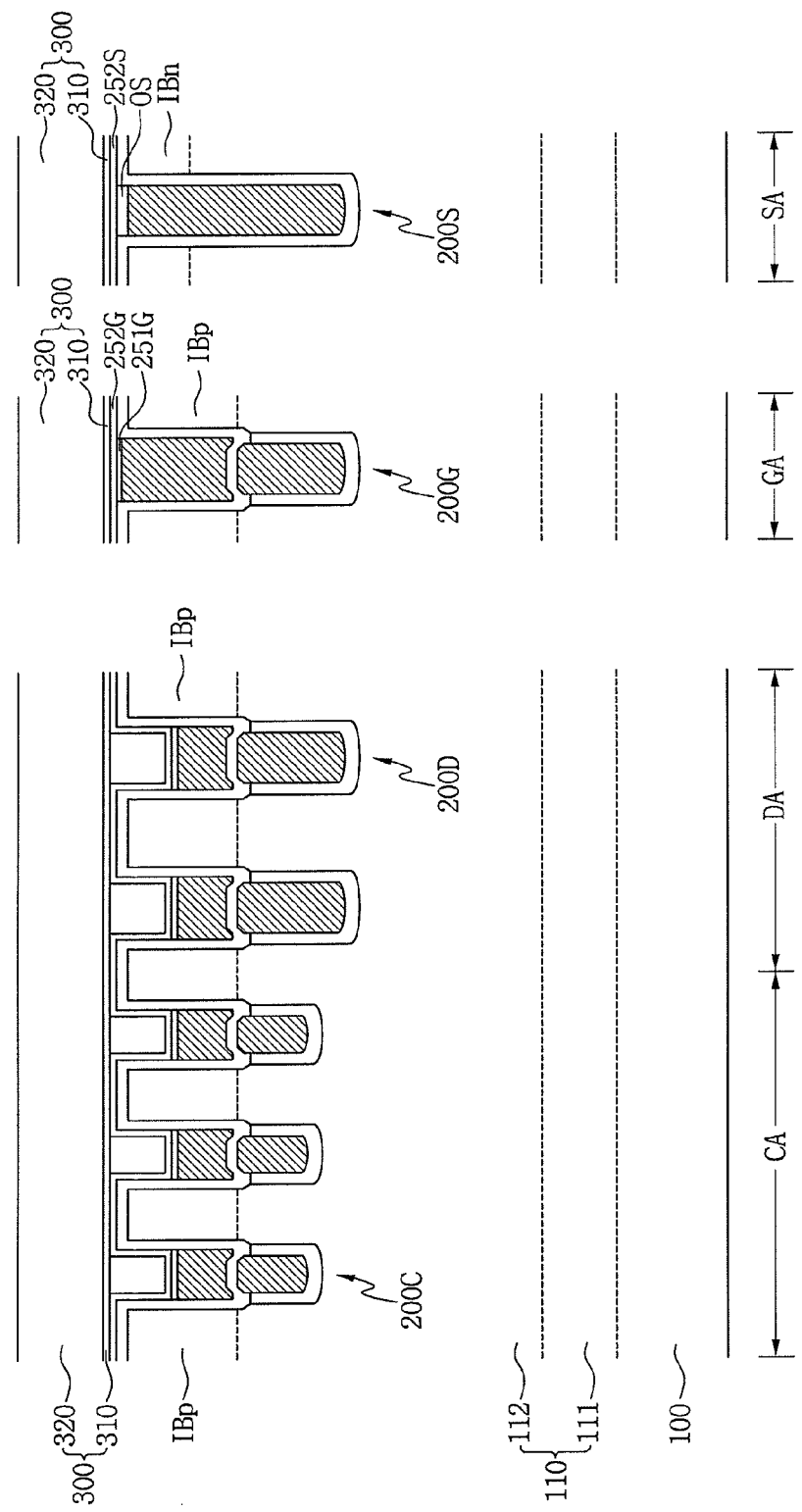

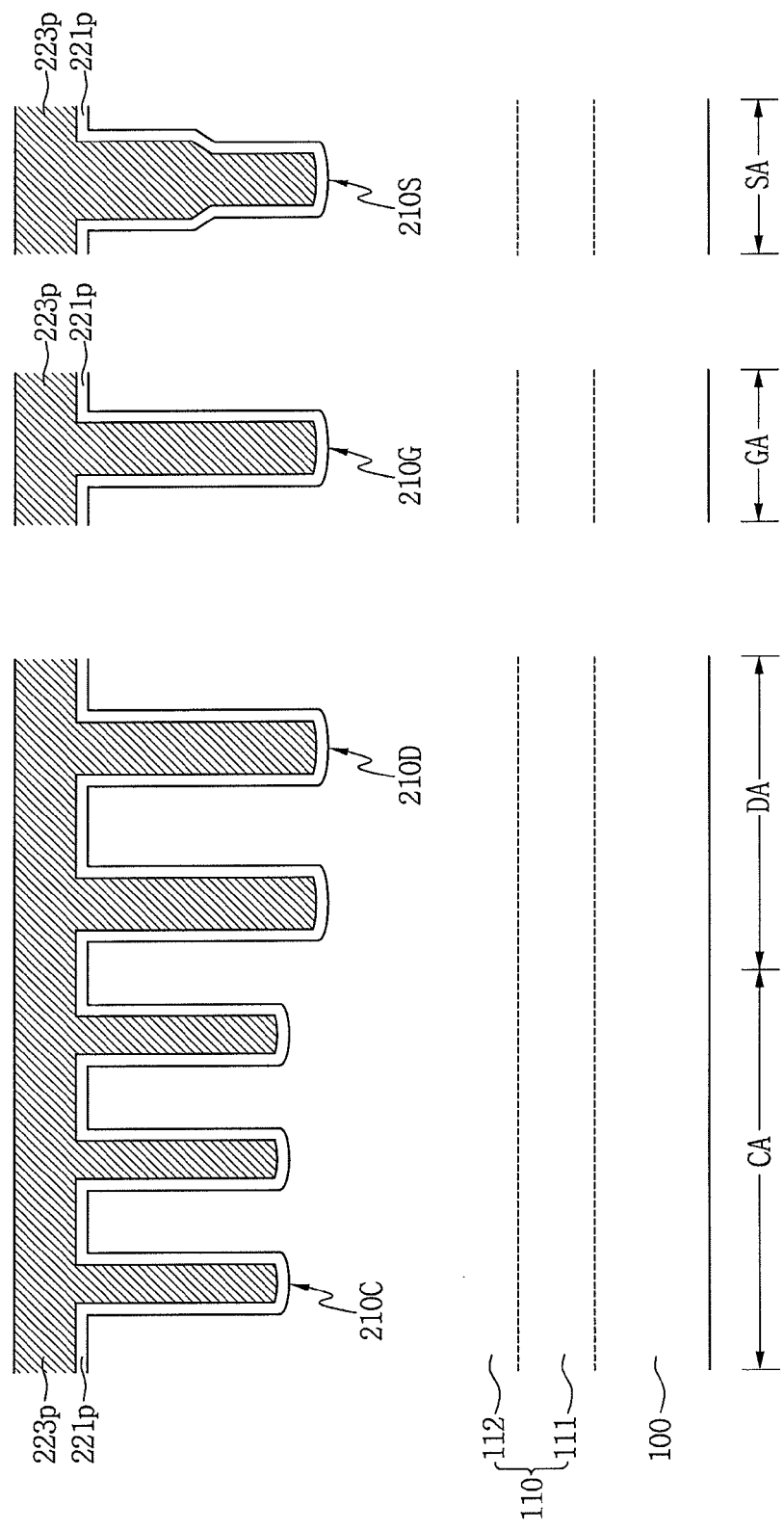

METHOD OF FABRICATING SEMICONDUCTOR DEVICE HAVING GROOVED SOURCE CONTACT REGION

CROSS-REFERENCE TO RELATED APPLICATION

This application claims priority under 35 U.S.C. §119 to Korean Patent Application No. 10-2013-0032818 filed on Mar. 27, 2013 in the Korean Intellectual Property Office, the disclosure of which is hereby incorporated by reference in its entirety.

BACKGROUND

1. Field

Embodiments of the inventive concepts relate to a discrete power supply semiconductor device including a low-voltage (LV) metal-oxide-semiconductor field effect transistor (MOSFET), and a method of fabricating the same.

2. Description of Related Art

To embody a transistor capable of reducing contact resistance and increasing power efficiency in a power supply semiconductor device, a trench-type gate electrode and a shield electrode are employed. Also, various research into further improving integration density is progressing.

SUMMARY

Embodiments of the inventive concepts provide a discrete power supply semiconductor device.

Other embodiments of the inventive concepts provide a semiconductor device having a metal-oxide-semiconductor field-effect-transistor (MOSFET) operable at a low voltage.

Other embodiments of the inventive concepts provide a method of fabricating a discrete power supply semiconductor device.

Other embodiments of the inventive concepts provide a method of fabricating a semiconductor device having a MOSFET operable at a low voltage.

In an aspect, a method of fabricating a semiconductor device, comprises: forming a channel layer on a substrate; forming trench patterns in the channel layer; forming impurity bodies in the channel layer between the trench patterns; forming grooves in the impurity bodies formed in the channel layer; forming source isolation regions in the impurity bodies at bottom portions of the grooves; and forming source regions in the impurity bodies at sidewall portions of the grooves.

In some embodiments, the forming of the channel layer comprises: forming a lower channel layer on the substrate using an epitaxial growth process, and forming an upper channel layer on the lower channel layer using an epitaxial growth process, wherein the substrate comprises phosphorus (P) at a first concentration, the lower channel layer comprises arsenic (As) at a second concentration lower than the first concentration, and the upper channel layer comprises phosphorus at a third concentration lower than the first concentration and higher than the second concentration.

In some embodiments, the forming of the trench patterns comprises forming cell trench patterns, and the forming of the cell trench patterns comprises: forming cell trenches in the channel layer; forming cell shield patterns in lower portions of the cell trenches; forming cell gate patterns on the cell shield patterns positioned within the cell trenches; and forming cell capping patterns on the cell gate patterns positioned within the cell trenches.

In some embodiments, the forming of the trench patterns further comprises forming a gate pickup trench pattern, and the forming of the gate trench patterns comprises: forming a gate pickup trench in the channel layer to have a greater width and a greater depth than the cell trench, forming a gate pickup shield pattern in a lower portion of the gate pickup trench; and forming a gate pickup pattern on the gate pickup shield pattern disposed in the gate pickup trench, wherein a top surface of the gate pickup pattern is co-planar with, or at a higher level than, a top surface of the channel layer.

In some embodiments, the forming of the gate pickup shield pattern comprises: conformally forming a preliminary gate pickup shield insulating layer on inner walls of the gate pickup trenches; forming a preliminary gate pickup shield electrode on the preliminary gate pickup shield insulating layer to fill the gate pickup trenches; recessing the preliminary gate pickup shield electrode to form a gate pickup shield electrode having a top surface disposed in a middle region of the gate pickup trench; and recessing the preliminary gate pickup shield insulating layer to form a gate pickup shield insulating layer exposing upper portions of the inner walls of the gate pickup trenches and having a top surface disposed at a lower level than the top surface of the gate pickup shield electrode.

In some embodiments, the forming of the gate pickup pattern comprises: forming a gate pickup insulating layer on the top surface of the gate pickup shield electrode and the inner walls of the gate pickup trenches; forming a preliminary gate pickup electrode on the gate pickup insulating layer to fill the gate pickup trench; and recessing the preliminary gate pickup electrode to form a gate pickup electrode having a top surface disposed in the middle of the gate pickup trench.

In some embodiments, the forming of the trench patterns further comprises forming a shield pickup trench pattern, and the forming of the shield pickup trench patterns comprises: forming a shield pickup trench in the channel layer to have a greater width and a greater depth than the cell trench, forming a shield pickup insulating layer on an inner wall of the shield pickup trench; and forming a shield pickup electrode on the shield pickup insulating layer to fill the shield pickup trench, wherein a top surface of the shield pickup electrode is co-planar with, or at a higher level than, a top surface of the channel layer.

In some embodiments, the forming of the cell shield patterns comprises: conformally forming a preliminary cell shield insulating layer on inner walls of the cell trenches; forming a preliminary cell shield electrode on the preliminary cell shield insulating layer to fill the cell trenches; recessing the preliminary cell shield electrode to form a cell shield electrode having a top surface disposed in the middle region of the cell trench; and recessing the preliminary cell shield insulating layer to form a cell shield insulating layer to expose upper portions of the inner walls of the cell trenches and having a top surface disposed at a lower level than the top surface of the cell shield electrode.

In some embodiments, the forming of the cell gate patterns comprises: forming a cell gate insulating layer on the top surface of the cell shield electrode and the inner walls of the cell trenches; forming a preliminary cell gate electrode on the cell gate insulating layer to fill the cell trenches; and recessing the preliminary cell gate electrode to form a cell gate electrode having a top surface disposed in the middle of the cell trench.

In some embodiments, the forming of the cell capping pattern comprises: forming a cell buffer layer on the top surface of the cell gate electrode; forming a cell capping stopper layer on the cell buffer layer and the inner walls of the cell trenches; forming a preliminary cell capping layer on the cell capping stopper layer to fill the cell trenches; and planarizing the preliminary cell capping layer to form a cell capping layer, so that the cell capping layer remains only within the cell trenches.

In some embodiments, the cell capping stopper layer includes silicon nitride, the cell capping layer includes silicon oxide, and a top surface of the cell capping layer is co-planar with, or at a higher level than, the top surface of the channel layer.

In some embodiments, each of the cell gate patterns has a greater horizontal width than each of the cell shield patterns.

In some embodiments, sidewall portions of the grooves are inclined, the forming of the source isolation regions comprises implanting P-type impurities along profiles of the bottom portions and sidewall portions of the grooves, and the forming of the source regions comprises obliquely implanting N-type impurities under the sidewall portions of the grooves to inverse the source isolation regions disposed under the sidewall portions of the grooves from a P type to an N type.

In some embodiments, the method further comprises: conformally forming a preliminary barrier metal on the bottom and sidewall portions of the grooves; forming a preliminary source electrode metal on the preliminary barrier metal to fill the grooves; and planarizing the preliminary source electrode metal.

In an aspect, a method of fabricating a semiconductor device comprises: forming a channel layer including N-type impurity regions on a substrate; forming trenches in the channel layer; forming shield patterns in lower regions of the trenches; forming gate patterns on the shield patterns; forming capping patterns on the gate patterns; forming P-type impurity regions in the channel layer between the capping patterns and between the gate patterns; etching the P-type impurity regions in the channel layer between the capping patterns to form grooves having inclined sidewall portions; and forming N-type source regions in the P-type impurity regions disposed in the channel layer at the inclined side surfaces of the grooves.

In an aspect, a method of fabricating a semiconductor device comprises: forming a plurality of cell trenches in a channel layer; forming cell gates in the cell trenches; forming a groove in the channel layer between neighboring ones of the cell trenches, the groove having a first width at an upper portion thereof and a second width at a lower portion thereof, the first width being greater than the second width; after forming the groove, forming a source isolation region at a bottom portion of the groove; and after forming the groove, forming source regions at opposed sidewalls of the channel layer between the cell trenches, the source regions having a first width at an upper portion thereof and a second width at a lower portion thereof, the second width being greater than the first width.

In some embodiments, forming the source regions comprises implanting first-type impurities, and wherein forming the source isolation region comprises implanting second-type impurities, wherein the second-type is opposite the first-type.

In some embodiments, forming the source regions follows forming the source isolation region.

In some embodiments, the method further comprises forming a source electrode in the groove, the source electrode connecting multiple ones of the grooves.

In some embodiments, the method further comprises planarizing an upper surface of the source electrode.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 1A and 2A are schematic longitudinal sectional views of semiconductor devices according to embodiments of the inventive concepts;

FIGS. 1B through 1E, 2B, and 2C are partial enlarged views of the semiconductor devices shown in FIGS. 1A and 2A;

FIGS. 3A through 3V and 4A through 4C are diagrams illustrating methods of fabricating semiconductor devices according to embodiments of the inventive concepts.

DETAILED DESCRIPTION OF EMBODIMENTS

Figure 1A:
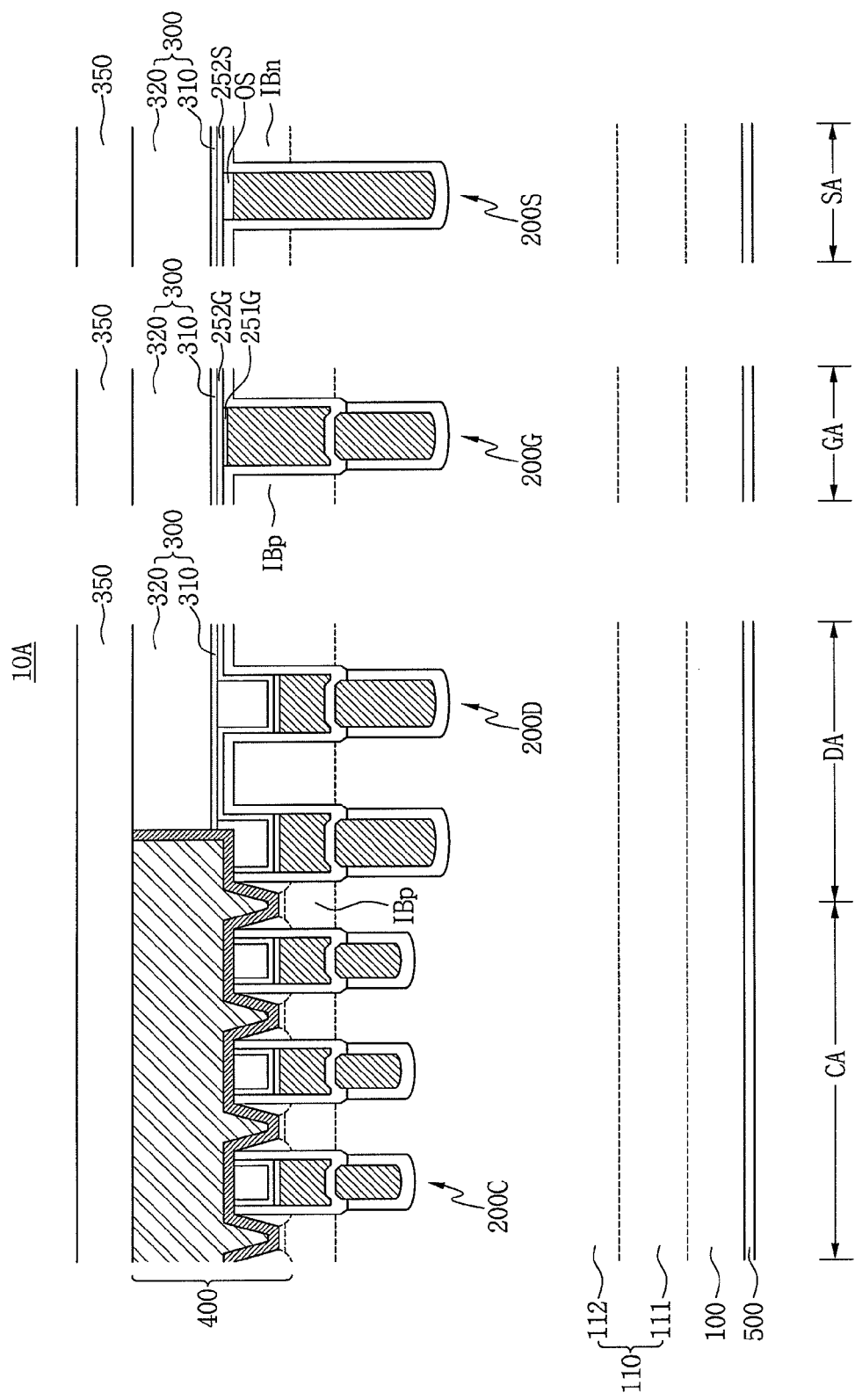

Various embodiments will now be described more fully with reference to the accompanying drawings in which some embodiments are shown. This inventive concepts may, however, be embodied in different forms and should not be construed as limited to the embodiments set forth herein. Rather, these embodiments are provided so that this disclosure is thorough and complete and fully conveys the scope of the inventive concepts to those skilled in the art.

The terminology used herein to describe embodiments of the inventive concepts is not intended to limit the scope of the inventive concepts. The articles "a," "an," and "the" are singular in that they have a single referent, however the use of the singular form in the present document should not preclude the presence of more than one referent. In other words, elements of the inventive concepts referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the present inventive concepts are described herein with reference to cross-section and/or plan illustrations that are schematic illustrations of idealized embodiments of the present inventive concepts. As such, variations from the shapes of the illustrations as a result, for example, of manufacturing techniques and/or tolerances, are to be expected. Thus, embodiments of the present inventive concepts should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present inventive concepts.

FIG. 1A is a longitudinal sectional view of a semiconductor device 10A according to embodiments of the inventive concepts, and FIGS. 1B through 1E are partial enlarged views of the semiconductor device of FIG. 1A. Referring to FIGS. 1A through 1E, the semiconductor device 10A according to the embodiments of the inventive concepts may include a substrate 100, a channel layer 110 disposed on the substrate 100, and trench patterns 200C, 200D, 200G, and 200S, a source pattern 400, and a drain electrode 500 disposed in the channel layer 110.

In some embodiments, the substrate 100 may comprise a silicon wafer including single crystalline silicon. In some embodiments, the substrate 100 may include phosphorus (P) at a concentration of about $1E^{20}/cm^3$. In various applications, the substrate 100 may be allocated into a cell area CA, a dummy area DA, a gate pickup area GA, and a shield pickup area SA. The cell area CA and the dummy area DA may be disposed adjacent to each other. The gate pickup area GA and the shield pickup area SA may be spaced apart from each other, for example, disposed so that they are isolated from each other.

The channel layer 110 may include a lower channel layer 111 and an upper channel layer 112. In some embodiments, the lower channel layer 111 may comprise a single crystalline silicon layer including arsenic (As) at a concentration of about $1E^{19}/cm^3$. In some embodiments, the upper channel layer 112 may comprise a single crystalline silicon layer including phosphorus at a concentration of about $1E^{17}/cm^3$. In various embodiments, other materials, other crystalline orientations or properties, and other concentrations may be employed, depending on the desired application.

The trench patterns 200C, 200D, 200G, and 200S may include cell trench patterns 200C, dummy trench patterns 200D, a gate pickup trench pattern 200G, and a shield pickup trench pattern 200S.

Figure 1B:
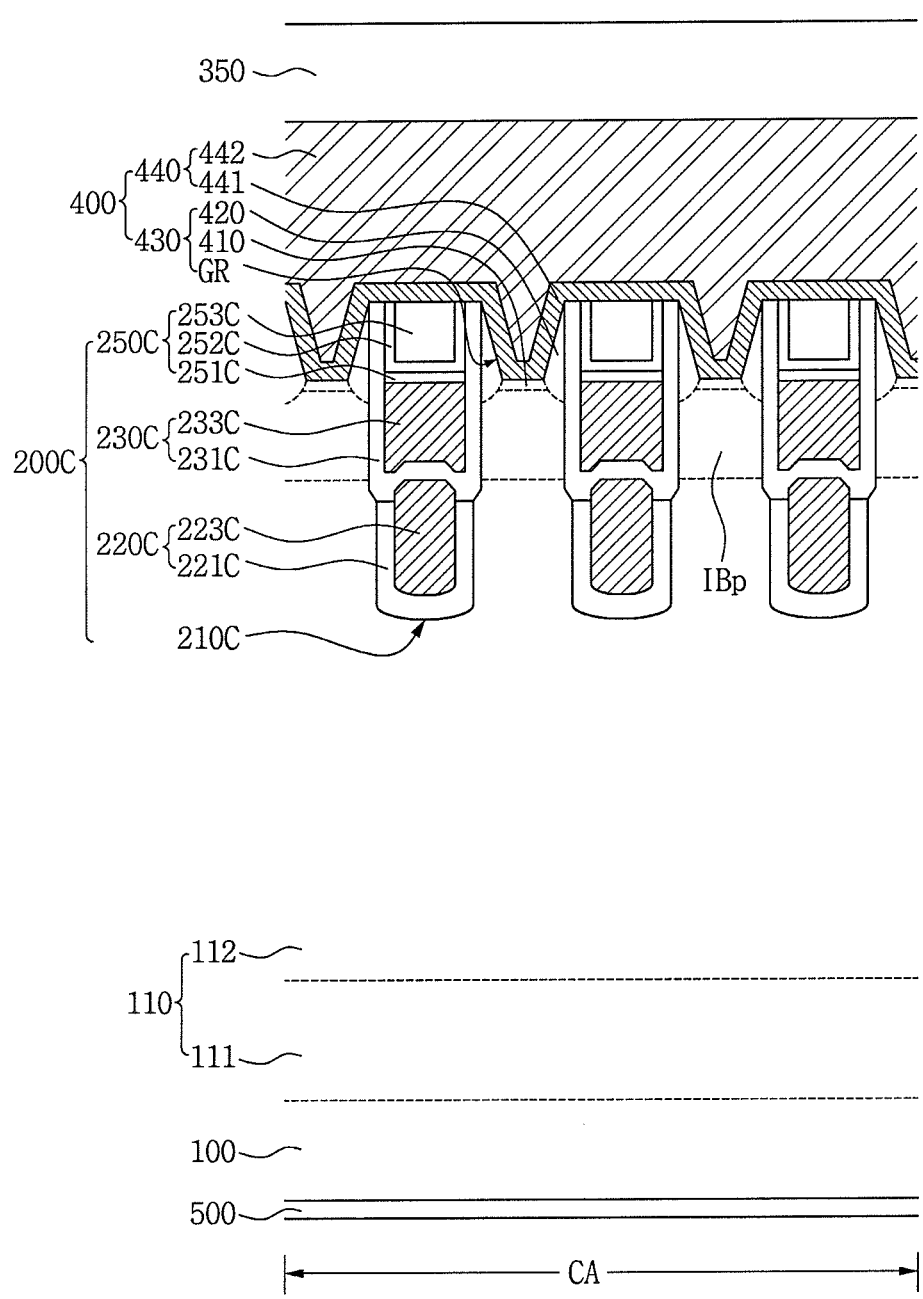
Figure 1C:
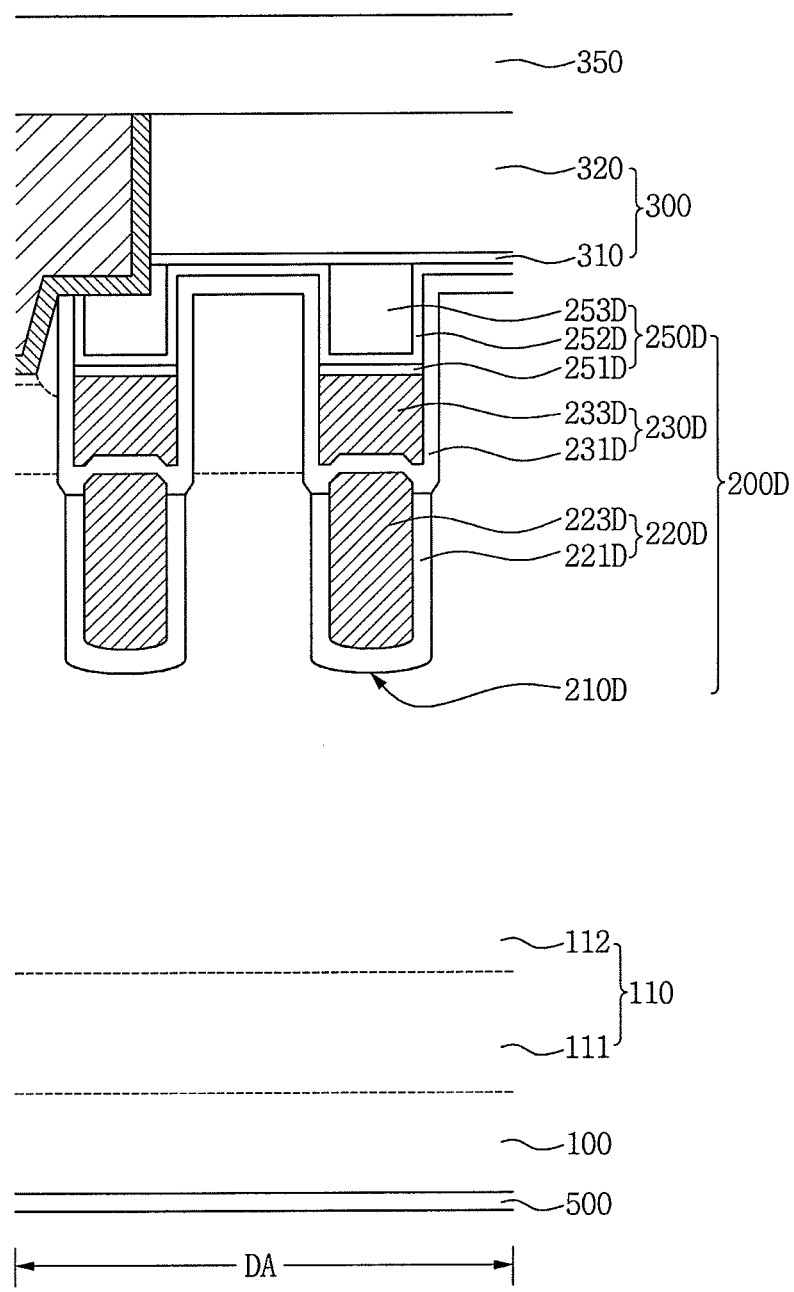

Referring generally to FIG. 1B, the cell trench patterns 200C may include a cell shield pattern 200C formed in a lower region of a cell trench 210C, a cell gate pattern 220C formed in a middle region of the cell trench 210C, and a cell capping pattern 250C formed in an upper region of the cell trench 210C.

The cell shield pattern 220C may include a cell shield insulating layer 221C and a cell shield electrode 223C. The cell shield insulating layer 221C may be conformally formed on an inner wall of the cell trench 210C. In some embodiments, the cell shield insulating layer 221C may comprise silicon oxide. In some embodiments, the cell shield electrode 223C may include a conductor, such as doped polycrystalline silicon (poly-Si). A top end of the cell shield electrode 223C may protrude in a vertical direction from a top end of the cell shield insulating layer 221C. A central portion of the top end of the cell shield electrode 223C may protrude upward, in a vertical direction relative to side portions thereof, while side portions thereof may be inclined.

The cell gate pattern 230C may include a cell gate insulating layer 231C and a cell gate electrode 233C. The cell gate insulating layer 231C may be conformally formed on a top surface of the cell shield pattern 220C and inner walls of the middle and upper regions of the cell trench 210C. In some embodiments, the cell gate insulating layer 231C may include oxidized silicon. In some embodiments, the cell gate electrode 233C may include a conductive material, such as doped polycrystalline silicon. In some embodiments, the cell gate insulating layer 231C may completely surround bottom and side surfaces of the cell gate electrode 233C. A bottom surface of the cell gate insulating layer 231C may have an upwardly concave or protruding profile along the protruding profile of the top end of the cell shield electrode 223C. The cell gate electrode 233C may have an upwardly concave bottom surface along the protruding profile of the top end of the cell shield electrode 223C. The cell gate insulating layer 231C may be used as an inter-electrode insulating layer between the cell gate electrode 233C and the cell shield electrode 223C.

The cell capping pattern 250C may include a cell buffer layer 251C, a cell capping stopper layer 252C, and a cell capping layer 253C. The cell buffer layer 251C may be formed on a top surface of the cell gate electrode 233C. In some embodiments, the cell buffer layer 251C may include oxidized silicon. The cell capping stopper layer 252C may be conformally formed on sidewalls of the cell buffer layer 251C and the cell gate insulating layer 231C. In some embodiments, the cell capping stopper layer 252C may include silicon nitride. In some embodiments, the cell capping layer 253C may include silicon oxide. The cell capping stopper layer 252C may surround bottom and side surfaces of the cell capping layer 253C. In some embodiments, top surfaces of the cell gate insulating layer 231C, the cell capping stopper layer 252C, and the cell capping layer 253C may be co-planar.

Referring generally to FIG. 1B, the dummy trench patterns 200D may include a dummy shield pattern 220D formed in a lower region of the dummy trench 210D, a dummy gate pattern 230D formed in a middle region of the dummy trench 210D, and a dummy capping pattern 250D formed in an upper region of the dummy trench 210D.

The dummy shield pattern 220D may include a dummy shield insulating layer 221D and a dummy shield electrode 233D. The dummy shield insulating layer 221D may be conformally formed on an inner wall of the dummy trench 210D. In some embodiments, the dummy shield insulating layer 221D may include silicon oxide. In some embodiments, the dummy shield electrode 223D may include a conductive material, such as doped polycrystalline silicon. A top end of the dummy shield electrode 223D may protrude in an upward direction from a top end of the dummy shield insulating layer 221D. A central portion of the top end of the dummy shield electrode 223D may protrude upward, while side portions thereof may be inclined.

The dummy gate pattern 230D may include a dummy gate insulating layer 231D and a dummy gate electrode 233D. The dummy gate insulating layer 231D may be conformally formed on a top surface of the dummy shield pattern 220D and the inner wall of the dummy trench 210D. In some embodiments, the dummy gate insulating layer 231D may include oxidized silicon. In some embodiments, the dummy gate electrode 233D may include a conductive material, such as doped polycrystalline silicon, or doped poly-Si. The dummy gate insulating layer 231D may completely surround bottom and side surfaces of the dummy gate electrode 233D. The dummy gate insulating layer 231D may be used as an inter-electrode insulating layer between the dummy gate electrode 233D and the dummy shield electrode 223D.

The dummy capping pattern 250D may include a dummy buffer layer 251D, a dummy capping stopper layer 252D, and a dummy capping layer 253D. The dummy buffer layer 251D may be formed on a top surface of the dummy gate electrode 233D. The dummy buffer layer 251D may include oxidized silicon. The dummy capping stopper layer 252D may be conformally formed on sidewalls of the dummy buffer layer 251D and the dummy gate insulating layer 231D. In some embodiments, the dummy capping stopper layer 252D may include silicon nitride. In some embodiments, the dummy capping layer 253D may include silicon oxide. The dummy capping stopper layer 252D may surround bottom and side surfaces of the dummy capping layer 253D. In some embodiments, top surfaces of the dummy capping stopper layer 252D and the dummy capping layer 253D may be co-planar.

Figure 1D:
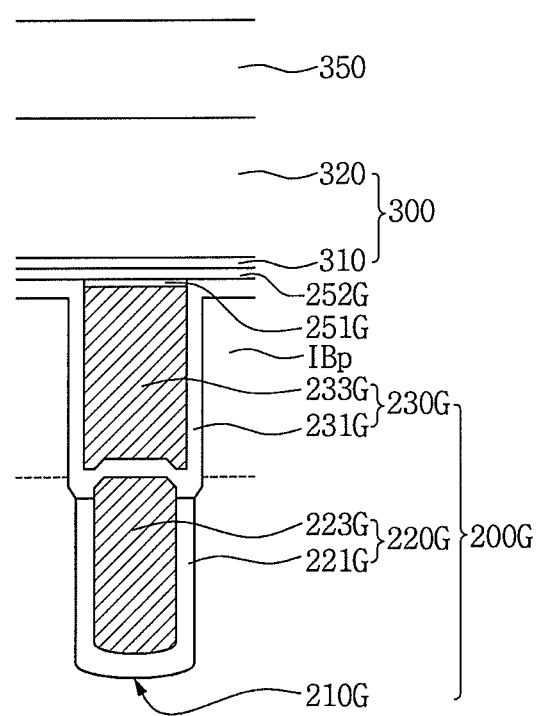

Referring generally to FIG. 1D, the gate pickup trench pattern 200G may include a gate pickup shield pattern 220G formed in a lower region of the gate pickup trench 210G, and a gate pickup pattern 230G formed in an upper region of the gate pickup trench 210G.

The gate pickup shield pattern 220G may include a gate pickup shield insulating layer 221G and a gate pickup shield electrode 223G. The gate pickup shield insulating layer 221G may be conformally formed on a bottom surface and inner wall of the gate pickup trench 210G. In some embodiments, the gate pickup shield insulating layer 221G may include silicon oxide. In some embodiments, the gate pickup shield electrode 223G may include a conductive material, such as doped poly-Si. A top end of the gate pickup shield electrode 223G may be on a same level as, or protrude in an upward direction relative to a top end of, the gate pickup shield insulating layer 221G.

The gate pickup pattern 230G may include a gate pickup insulating layer 231G and a gate pickup electrode 233G. The gate pickup insulating layer 231G may be conformally formed on a top surface of the gate pickup shield electrode 223G and an inner wall of the gate pickup trench 210G. In some embodiments, the gate pickup insulating layer 231G may include oxidized silicon. In some embodiments, the gate pickup gate electrode 233G may include a conductor, such as doped poly-Si. The gate pickup insulating layer 231G may completely surround bottom and side surfaces of the gate pickup electrode 233G. In some embodiments, the gate pickup insulating layer 231G may be used as an inter-electrode insulating layer between the gate pickup electrode 233G and the gate pickup shield electrode 223G. The gate pickup trench pattern 200G may further include a gate pickup buffer layer 251G formed on the gate pickup electrode 233G. The gate pickup trench pattern 200G may further include a gate pickup capping stopper layer 252G formed relatively flat in a horizontal direction on the gate pickup buffer layer 251G and the gate pickup insulating layer 231G.

Figure 1E:
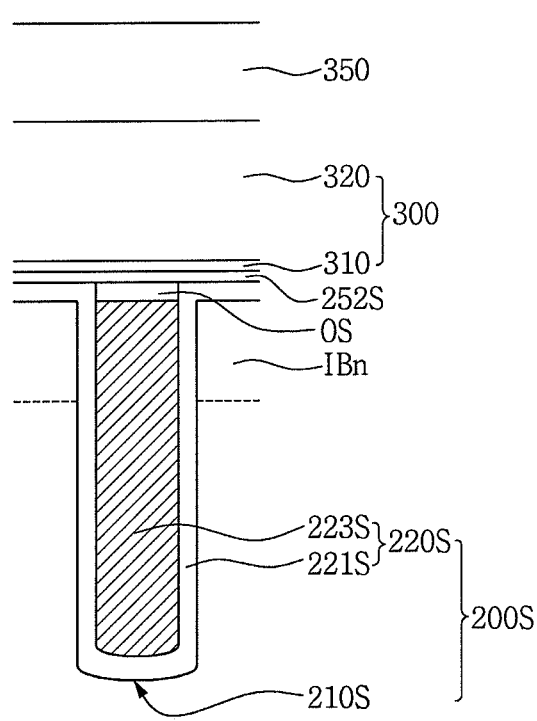

Referring generally to FIG. 1E, the shield pickup trench pattern 200S may include a shield pickup pattern 220S formed within the shield pickup trench 210S. The shield pickup pattern 220S may include a shield pickup insulating layer 221S and a shield pickup electrode 223S. The shield pickup insulating layer 221S may be conformally formed on a bottom surface and inner wall of the shield pickup trench 210S. In some embodiments, the shield pickup insulating layer 221S may include silicon oxide. In some embodiments, the shield pickup electrode 223S may be formed on the shield pickup insulating layer 221S to fill the shield pickup trench 210S. In some embodiments, the shield pickup electrode 223S may include a conductive material, such as doped poly-Si. In some embodiments, the shield pickup trench pattern 220S may further include an oxidized silicon layer OS formed on the shield pickup electrode 223S.

Referring back to FIG. 1A, impurity bodies IBp and IBn may be formed in the upper channel layer 112. In some embodiments, the impurity bodies IBp and IBn may include P-type impurity bodies IBp formed in the cell area CA, the dummy area DA, and the gate pickup area GA, and an N-type impurity body IBn formed in the shield pickup region SA. In some embodiments, the P-type impurity bodies IBp may have a concentration of about $1E^{16}/cm^3$ to $1E^{18}/cm^3$. In some embodiments, the N-type impurity body IBn may have a higher concentration than the P-type impurity bodies IBp by at least about one order of $1E/cm^3$.

A source pattern 400 may be formed in the cell area CA. Referring back to FIG. 1B, the source pattern 400 may include source contact regions 430 and a source electrode 440. The source contact regions 430 may be formed in the P-type impurity body IBp disposed in the cell area CA. The source contact regions 430 may include grooves GR having inclined side surfaces, source isolation regions 410 disposed under bottom surfaces of the grooves GR, and source regions 420 disposed under side surfaces of the grooves GR. The bottom surfaces of the grooves GR may be horizontally parallel to the surface of the substrate 100. In some embodiments, the source isolation regions 410 may have a concentration of about $1E^{18}/cm^3$ to $1E^{20}/cm^3$. In some embodiments, the source regions 420 may have a higher concentration than the source isolation regions 410 by at least about one order of $1E/cm^3$.

A source electrode 440 may be formed on the cell trench patterns 200C and the source contact regions 430 disposed in the cell area CA. The source electrode 440 may include a source barrier metal 441 and a source electrode metal 442. The source barrier metal 441 may be conformally formed on top surfaces of the cell trench patterns 200C, and bottom surfaces and side surfaces of the grooves GR. In some embodiments, the source barrier metal 441 may include at least one of titanium (Ti), titanium nitride (TiN), tantalum (Ta), tantalum nitride (TaN), titanium tungsten (TiW), tungsten nitride (WN), or other barrier metals. In some embodiments, the source electrode metal 442 may include a metal (e.g., tungsten) or a metal alloy. The source electrode 440 may also be formed on portions of the dummy trench patterns 200D of the dummy area DA.

Returning to FIG. 1A, an interlayer insulating layer 300 may be formed on the gate pickup pattern 230G of the gate pickup area GA and the shield pickup pattern 220G of the shield pickup area SA. The interlayer insulating layer 300 may include a lower interlayer insulating layer 310 and an upper interlayer insulating layer 320. In some embodiments, the lower interlayer insulating layer 310 may include silicon nitride, and the upper interlayer insulating layer 320 may include silicon oxide. The interlayer insulating layer 300 may optionally also be formed on portions of the dummy trench patterns 200D disposed in the dummy area DA.

Returning to FIG. 1C, a shield capping stopper layer 252S may be interposed between the shield pickup pattern 220S of the shield pickup area SA and interlayer insulating layer 300 of the shield pickup area SA so as to extend in a horizontal direction as shown.

Returning to FIG. 1A, a passivation layer 350 may be formed on the source pattern 400 and the interlayer insulating layer 300. In some embodiments, the passivation layer 350 may include an insulating material, such as silicon oxide, silicon nitride, or polyimide.

The semiconductor device 10A according to embodiments of the inventive concepts may include the cell shield patterns 220C having a relatively small horizontal width and the cell gate patterns 230G having a relatively large horizontal width. The cell gate insulating layer 231C may include oxidized silicon having excellent electrical, physical, and mechanical properties. Accordingly, the semiconductor device 10A according to the embodiments of the inventive concepts may perform switching operations with enhanced characteristics.

The semiconductor device 10A according to embodiments of the inventive concepts may have a grooved contact structure. Accordingly, the resulting contact area between the source electrode 440 and the source region 420 is increased, and therefore contact resistance between the source electrode 440 and the source region 420 may be reduced.

The semiconductor device 10A according to embodiments of the inventive concepts may include the source regions 420 obliquely implanted at the inclined side surfaces of the groove GR, and further may include source isolation regions 410 disposed under a lower portion of the groove GR. Accordingly, an electrical short between the source regions 420 may be reliably prevented.

The semiconductor device 10A according to embodiments of the inventive concepts may include the cell shield electrode 223C electrically connected to the source electrode 440. Accordingly, power efficiency may be improved.

FIG. 2A is a longitudinal sectional view of a semiconductor device 10B according to embodiments of the inventive concepts, and FIGS. 2B and 2C are partial enlarged views of the semiconductor device of FIG. 2A.

Referring to FIGS. 2A through 2C, the semiconductor device 10B according to the embodiments of the inventive concepts may include a substrate 100, a channel layer 110 disposed on the substrate 100, trench patterns 200C, 200D, 200G, and 200S disposed in the channel layer 110, a source pattern 400, pickup patterns 450G and 450G, and a drain electrode 500. Referring to FIG. 2B, the pickup patterns 450G and 450S may include a gate pickup pattern 450G and a shield pickup pattern 450S. The gate pickup pattern 450G may include a gate pickup barrier metal 451G and a gate pickup metal 452G. The gate pickup barrier metal 451G may surround bottom and side surfaces of the gate pickup metal 452G. The gate pickup pattern 450G may have a smaller horizontal width than the gate pickup electrode 233G. The shield pickup pattern 450S may include a shield pickup barrier metal 451S and a shield pickup metal 452S. The shield pickup barrier metal 451S may surround bottom and side surfaces of the shield pickup metal 452S. The shield pickup pattern 450S may have a smaller horizontal width than the gate pickup shield electrode 223G. In some embodiments, the gate pickup barrier metal 451G and the shield pickup barrier metal 451S may include at least one of Ti, TiN, Ta, TaN, TiW, WN, or other barrier metals. The gate pickup metal 452G and the shield pickup metal 452S may include a metal (e.g., tungsten) or a metal alloy. The shield pickup trench 210S may have a lower region having a relatively small width, and an upper region having a relatively great width. Accordingly, the shield pickup electrode 223S may also have a lower region having a small width, and an upper region having a relatively large width.

Referring to FIG. 2C, the gate pickup pattern 450G, the gate pickup electrode 233G, the cell gate electrode 233C, and the dummy gate electrode 233D may be electrically connected to one another. The shield pickup pattern 450S, the shield pickup electrode 223s, the cell shield electrode 223C, and the dummy shield electrode 223D may be electrically connected to one another. The gate pickup pattern 450G and the shield pickup pattern 450S may include pads or interconnections.

Figure 3A:
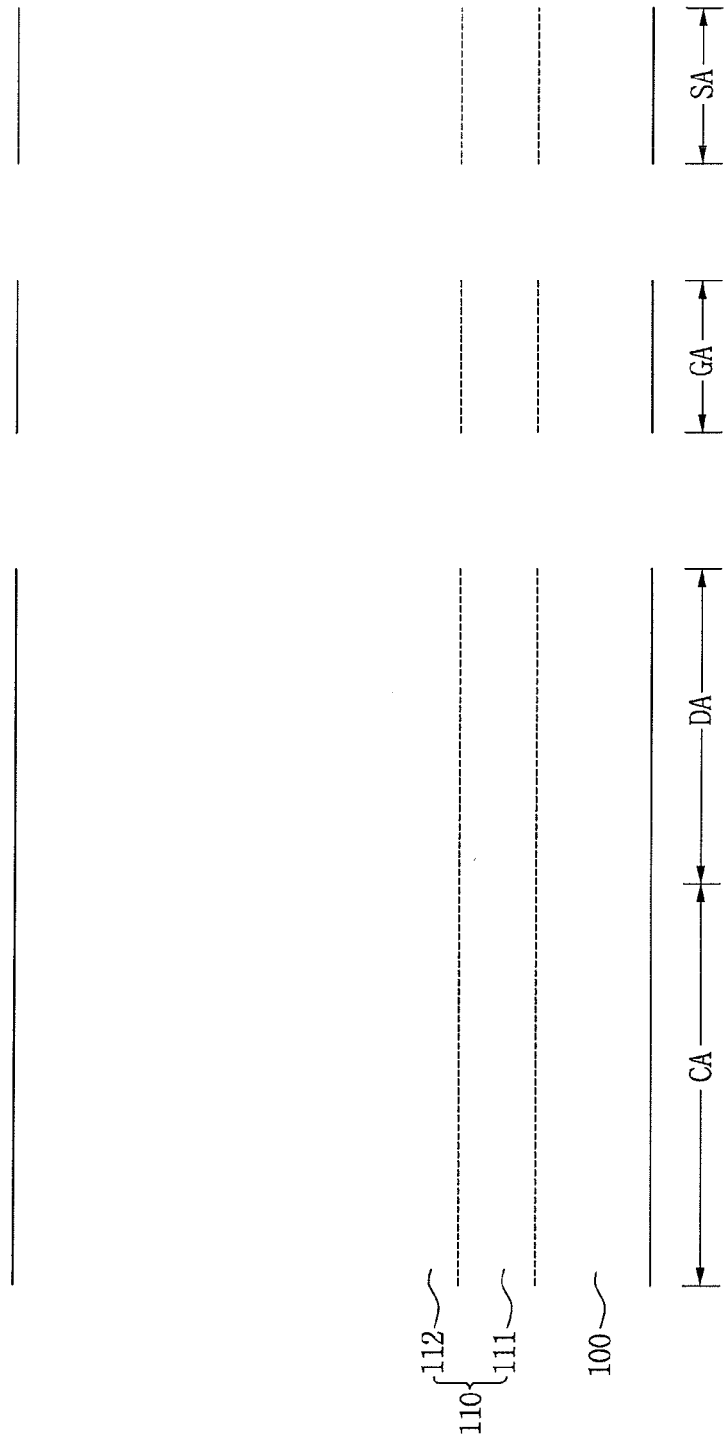

Referring to FIG. 3A, a method of fabricating a semiconductor device according to embodiments of the inventive concepts may include forming a channel layer 110 on a substrate 100. The channel layer 110 may include a lower channel layer 111 and an upper channel layer 112. The substrate 100 and the channel layer 110 may include N-type impurities. For example, in some embodiments, the substrate 100 may be a single crystalline silicon wafer containing phosphorus at a concentration of about $1E^{20}/cm^3$. In some embodiments, the lower channel layer 111 and the upper channel layer 112 may be formed using an epitaxial growth process. For example, the formation of the lower channel layer 111 may include supplying reactive gases containing $SiH_4$ and As ions into a reaction chamber, and performing an epitaxial growth process. In some embodiments, the formation of the upper channel layer 112 may include supplying reactive gases containing $SiH_4$ and P ions (e.g., $POCl_4$) into the reactive chamber, and performing an epitaxial growth process. In some embodiments, the substrate 100 may be allocated into a cell area CA, a dummy area DA, a gate pickup area GA, and a shield pickup area SA.

Figure 3B:
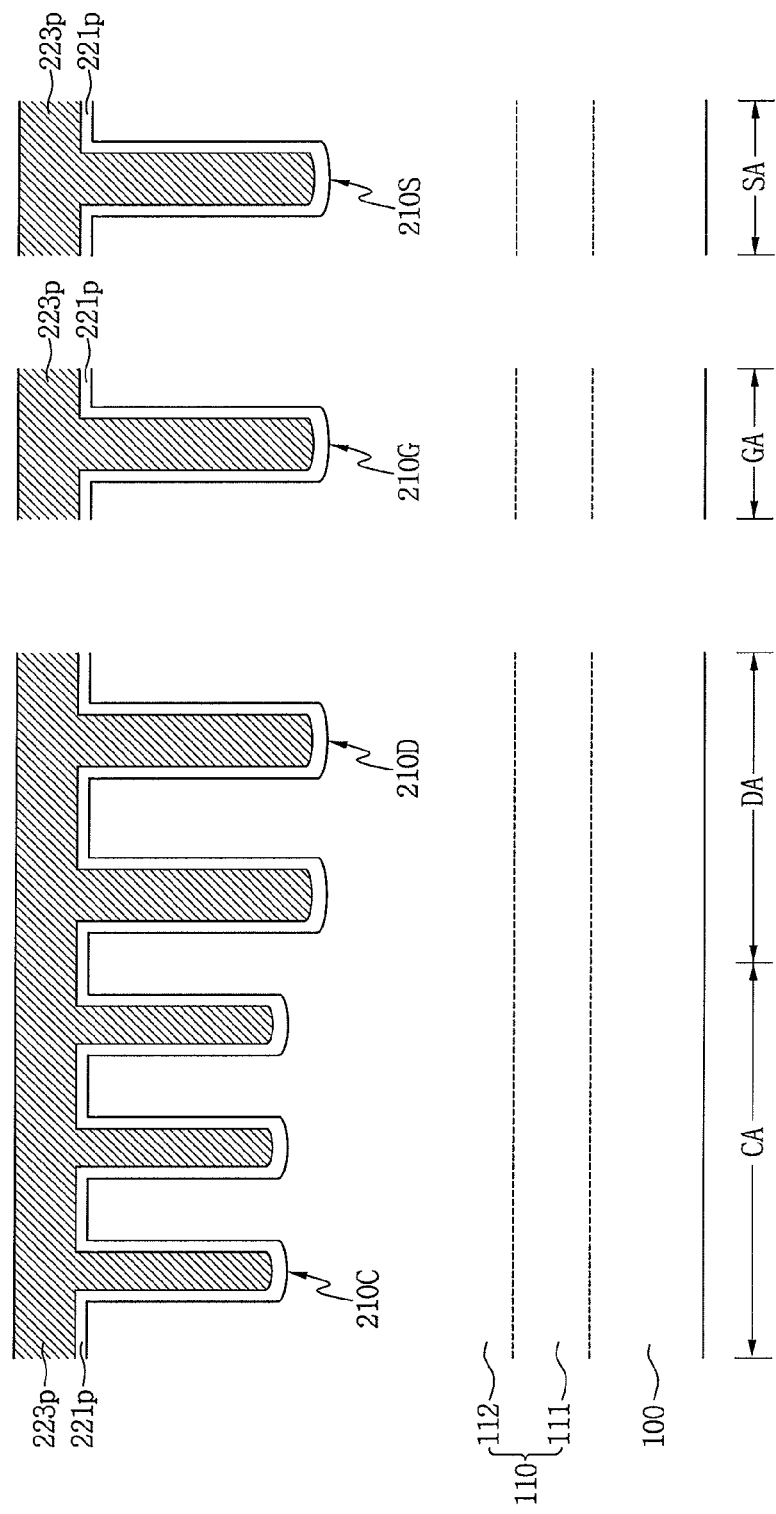

Referring to FIG. 3B, the method may include forming trenches 210C, 210D, 210G, and 210S in the upper channel layer 112, conformally forming a preliminary shield insulating layer 221p, and forming a preliminary shield electrode 223p on the preliminary shield insulating layer 221p to fill the trenches 210C, 210D, 210G, and 210S. The trenches 210C, 210D, 210G, and 210S may include cell trenches 210C disposed in the cell area CA, dummy trenches 210D disposed in the dummy area DA, a gate pickup trench 210G disposed in the gate pickup area GA, and a shield pickup trench 210S disposed in the shield pickup area SA. The dummy trenches 210D, the gate pickup trench 210G, and the shield pickup trench 210S may be formed to have greater depth and width than the cell trenches 210C. In some embodiments, the preliminary shield insulating layer 221p may include silicon oxide formed using an oxidation process, a sub-atmosphere chemical vapor deposition (CVD) process, or an atomic layer deposition (ALD) process. The preliminary shield electrode 223p may include poly-Si formed using a CVD process.

Figure 3C:
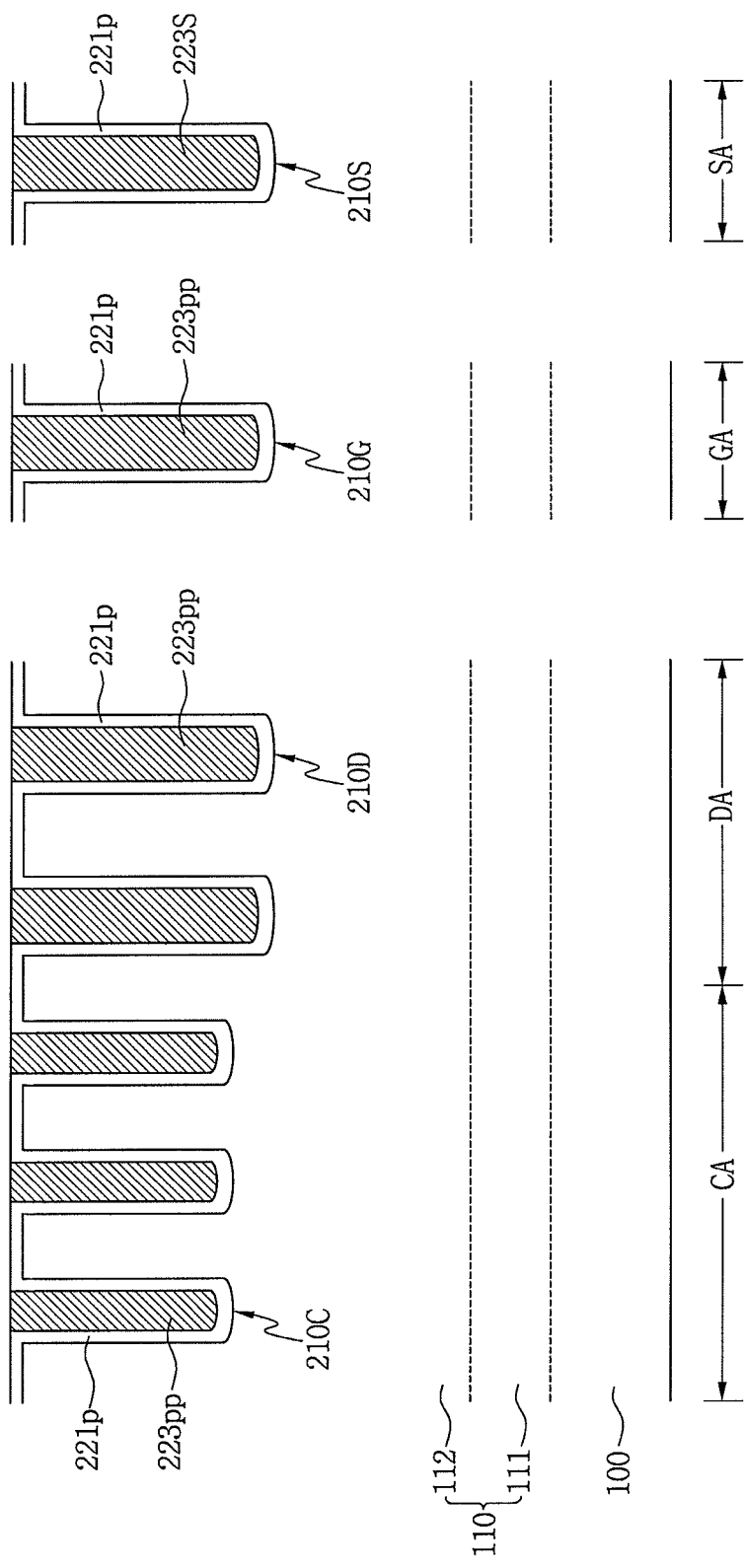

Referring to FIG. 3C, the method may include planarizing the preliminary shield electrode 223p to form a planarized preliminary shield electrode 223pp and a shield pickup electrode 223S, which are left only within the trenches 210C, 210D, 210G, and 210S. The planarized preliminary shield electrode 223pp may fill the cell trenches 210C, the dummy trenches 210D, and the gate pickup trenches 210G, while the shield pickup electrode 223S may fill the shield pickup trench 210S. As a result of the planarization process, a top surface of the preliminary shield insulating layer 221p disposed on the upper channel layer 112 may be exposed. In some embodiments, the top surface of the shield pickup electrode 223S may be co-planar with or at a higher level than a top surface of the upper channel layer 112. Alternatively, the top surface of the shield pickup electrode 223S may be co-planar with the top surface of the preliminary shield insulating layer 221p. In some embodiments, the planarization process may include a chemical mechanical polishing (CMP) process or an etchback process.

Figure 3D:
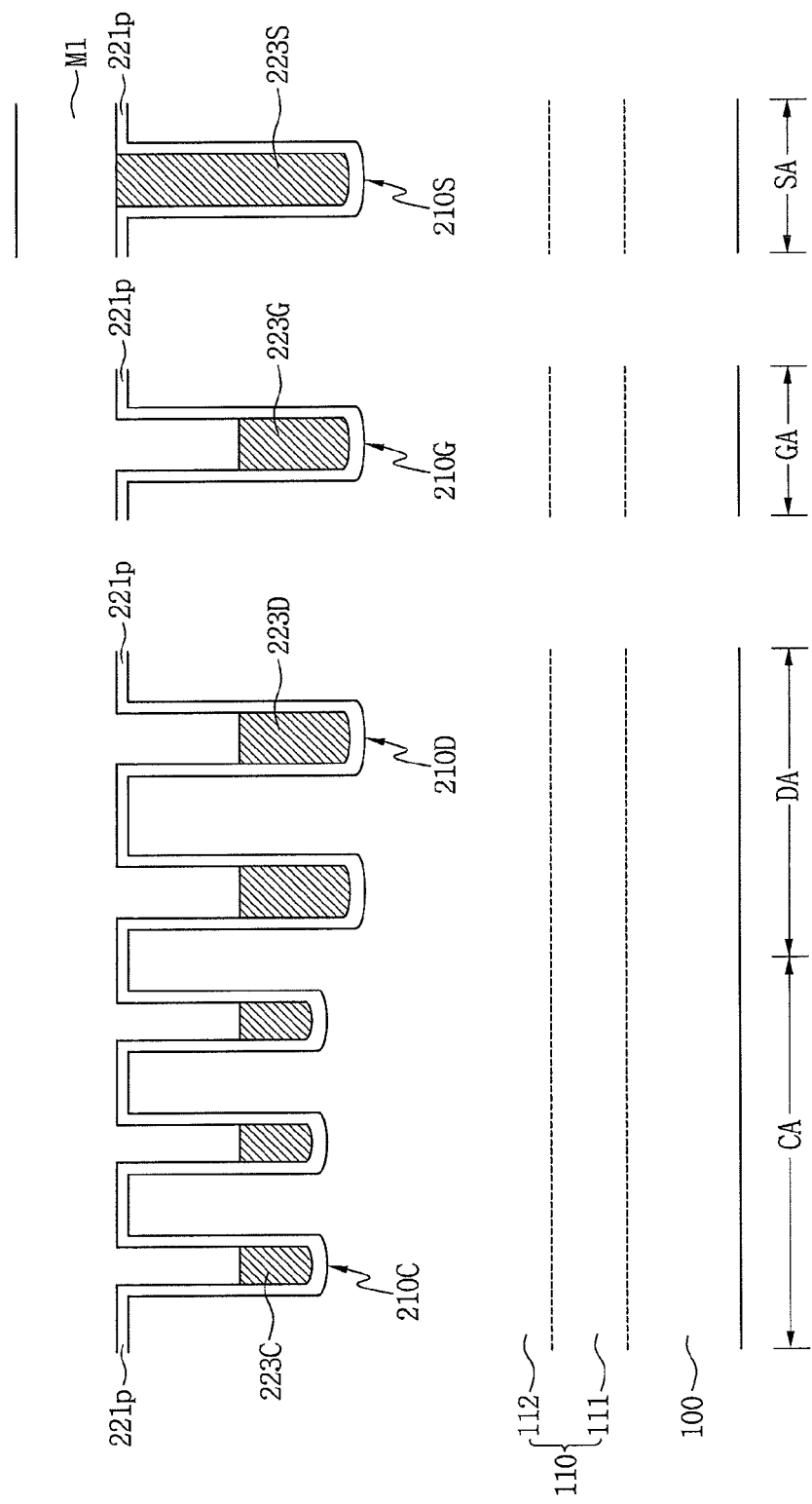

Referring to FIG. 3D, the method may include forming a mask pattern M1 to cover the shield pickup area SA, and recessing the planarized preliminary shield electrode layer 223pp to form shield electrodes 223C, 223D, and 223G. The shield electrodes 223C, 223D, and 223G may include cell shield electrodes 223C disposed within the cell trenches 210C, dummy shield electrodes 223D disposed within the dummy trenches 210D, and a gate pickup shield electrode 223G disposed within the gate pickup trench 210G. Top surfaces of the shield electrodes 223C, 223D, and 223G may be respectively disposed in middle regions of the trenches 210C, 210D, and 210G, and the preliminary shield insulating layer 221p may be exposed on inner walls of the trenches 210C, 210D, and 210G. In some embodiments, the process of recessing of the planarized preliminary shield electrode layer 223pp may include an etchback process. The mask pattern M1 may include a photoresist pattern.

Figure 3E:
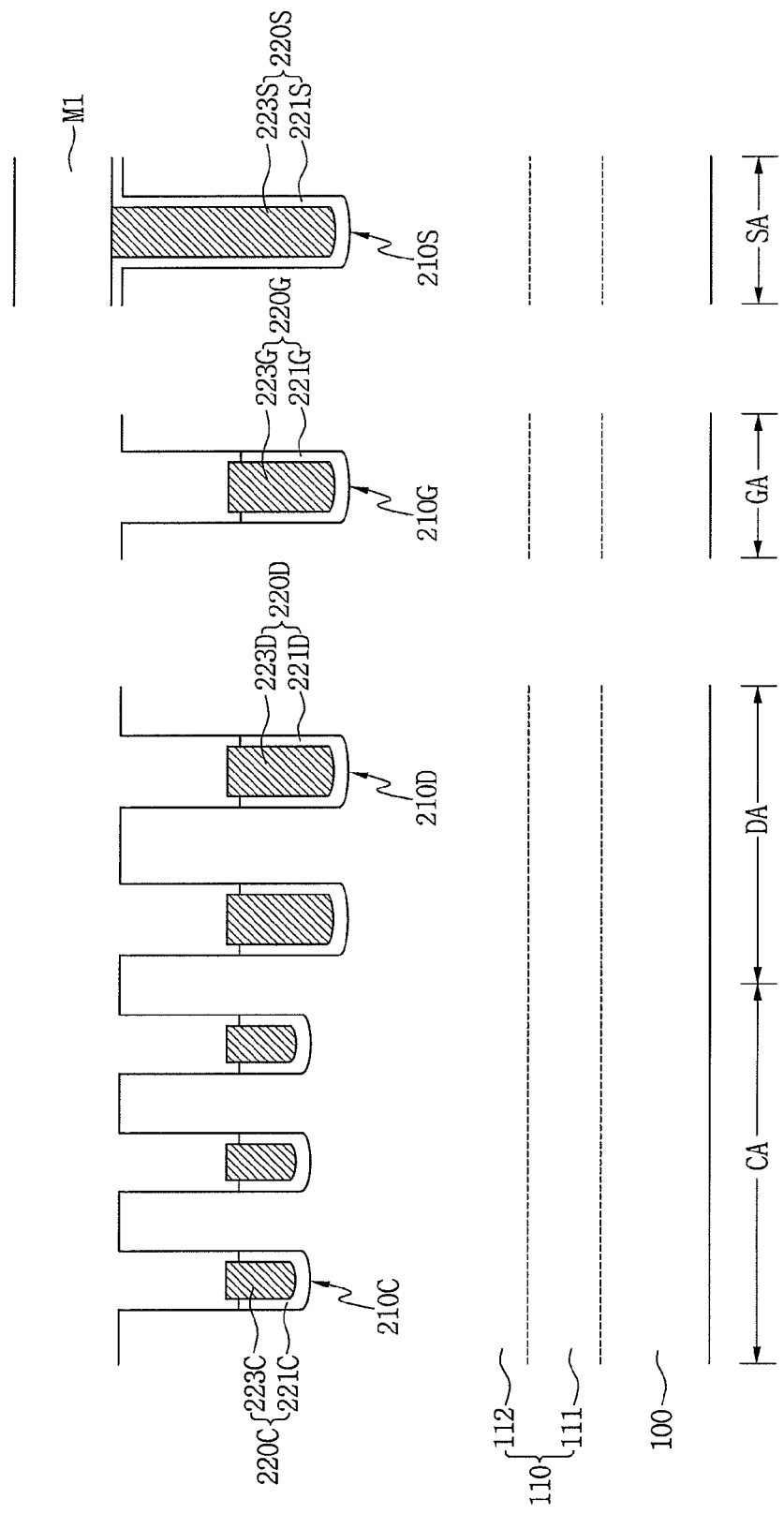

Referring to FIG. 3E, the method may include partially removing and recessing the preliminary shield insulating layer 221p exposed in the cell area CA, the dummy area DA, and the gate pickup area GA using, for example, an etchback process to form shield insulating layers 221C, 221D, and 221G. The shield insulating layers 221C, 221D, and 221G may include a cell shield insulating layer 221C, a dummy shield insulating layer 221D, and a gate pickup shield insulating layer 221G. The preliminary shield insulating layer 221p disposed in the shield area SA may be modified into a shield pickup insulating layer 221S extending onto the surface of the upper channel layer 112. Within the respective trenches 210C, 210D, and 210G, top surfaces of the shield insulating layers 221C, 221D, and 221G may be positioned at a lower level than the top surfaces of the shield electrodes 223C, 223D, and 223G. That is, upper portions of the shield electrodes 223C, 223D, and 223G may protrude in an upward direction from top ends of the shield insulating layers 221C, 221D, and 221G. Afterward, the mask pattern M1 may be removed.

Cell shield patterns 220C, dummy shield patterns 220D, and a gate pickup shield pattern 220G respectively including the shield insulating layers 221C, 221D, and 221G and the shield electrodes 223C, 223D, and 223G may be formed within the cell area CA, the dummy area DA, and the gate pickup area GA, while a shield pickup pattern 220S including the shield pickup insulating layer 221S and the shield pickup electrode 223S may be formed within the shield pickup area SA.

The shield insulating layers 221C, 221D, and 221G may surround bottom surfaces and all side surfaces of the shield electrodes 223C, 223D, and 223G, respectively, and the shield pickup insulating layer 221S may surround a bottom surface and all side surfaces of the shield pickup electrode 223S.

Referring to FIG. 3F, the method may further include forming a preliminary gate insulating layer 231p on top surfaces of the shield electrodes 223C, 223D, and 223G, inner walls of the trenches 210C, 210D, and 210G, and surfaces of the upper channel layer 112 in the cell area CA, the dummy area DA, and the gate pickup area GA. The formation of the preliminary gate insulating layer 231p may include oxidizing the recessed top surfaces of the shield electrodes 223C, 223D, and 223G, the inner walls of the trenches 210C, 210D, and 210G, and the exposed surfaces of the upper channel layer 112. Accordingly, the preliminary gate insulating layer 231p may include an oxidized silicon layer. During the current process, since side portions of the top surfaces of the shield electrodes 223C, 223D, 223G, and 223S are oxidized more easily and rapidly than central portions thereof, the upper portions of the shield electrodes 223C, 223D, and 223G may be modified into protruding portions. Since the surfaces of the inner walls of the trenches 210C, 210D, and 210G are oxidized, the upper portions of the trenches 210C, 210D, and 210G may have widened shapes. For instance, each of the cell trenches 210C, the dummy trenches 210D, and the gate pickup trench 210G may include a lower region having a relatively small width, and an upper region having a relatively great width. Each of the inner walls of the cell trenches 210C, the dummy trenches 210D, and the gate pickup trench 210G may include a discontinuous portion with a sharply varied width. An oxidized silicon layer OS may be formed on a top surface of the shield pickup pattern 220S disposed in the shield pickup area SA.

Figure 3G:
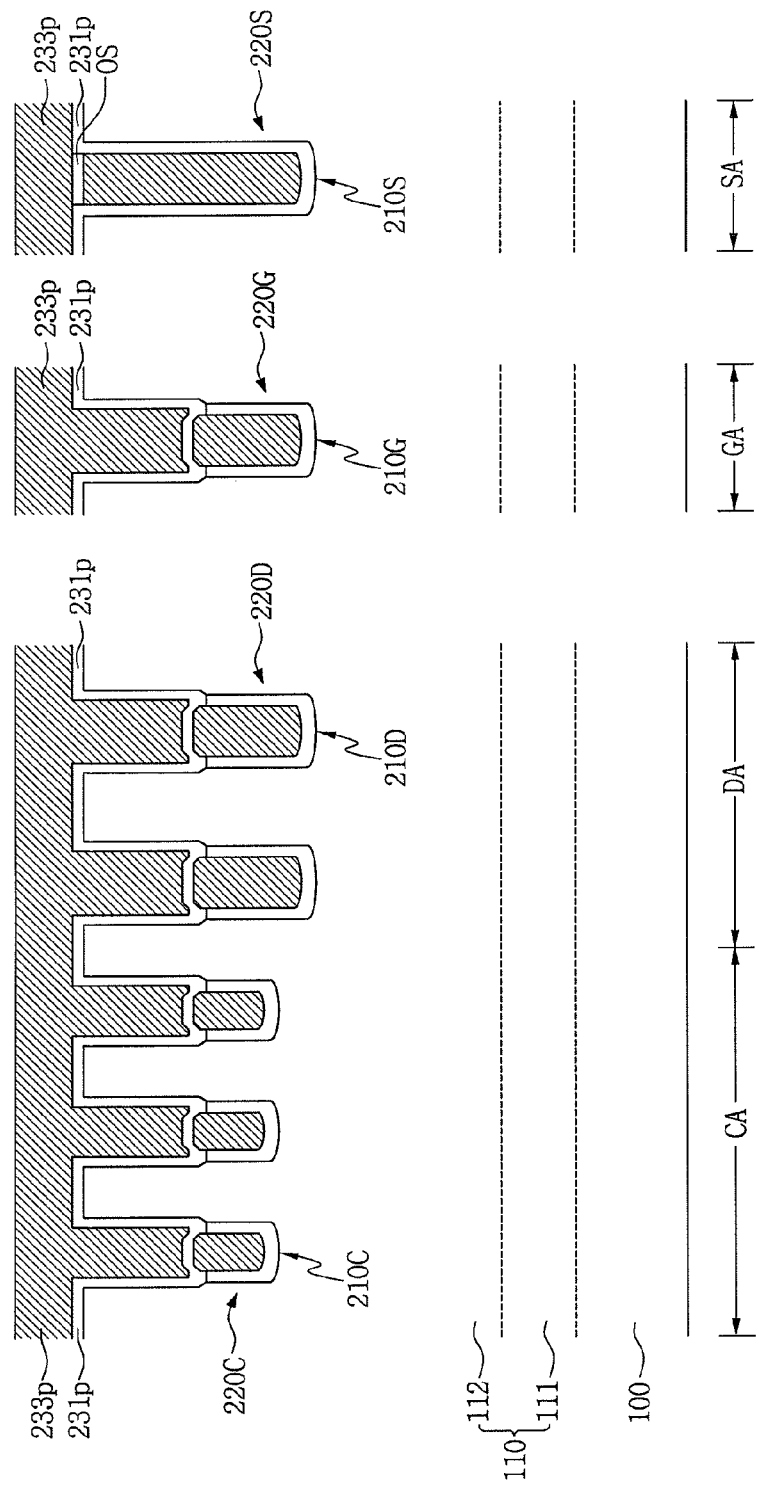

Referring to FIG. 3G the method may include blanketly forming a preliminary gate electrode 233p on the preliminary gate insulating layer 231p to fill the trenches 210C, 210D, and 210G. In some embodiments, the preliminary gate electrode 233p may include poly-Si formed using a CVD process.

Figure 3H:
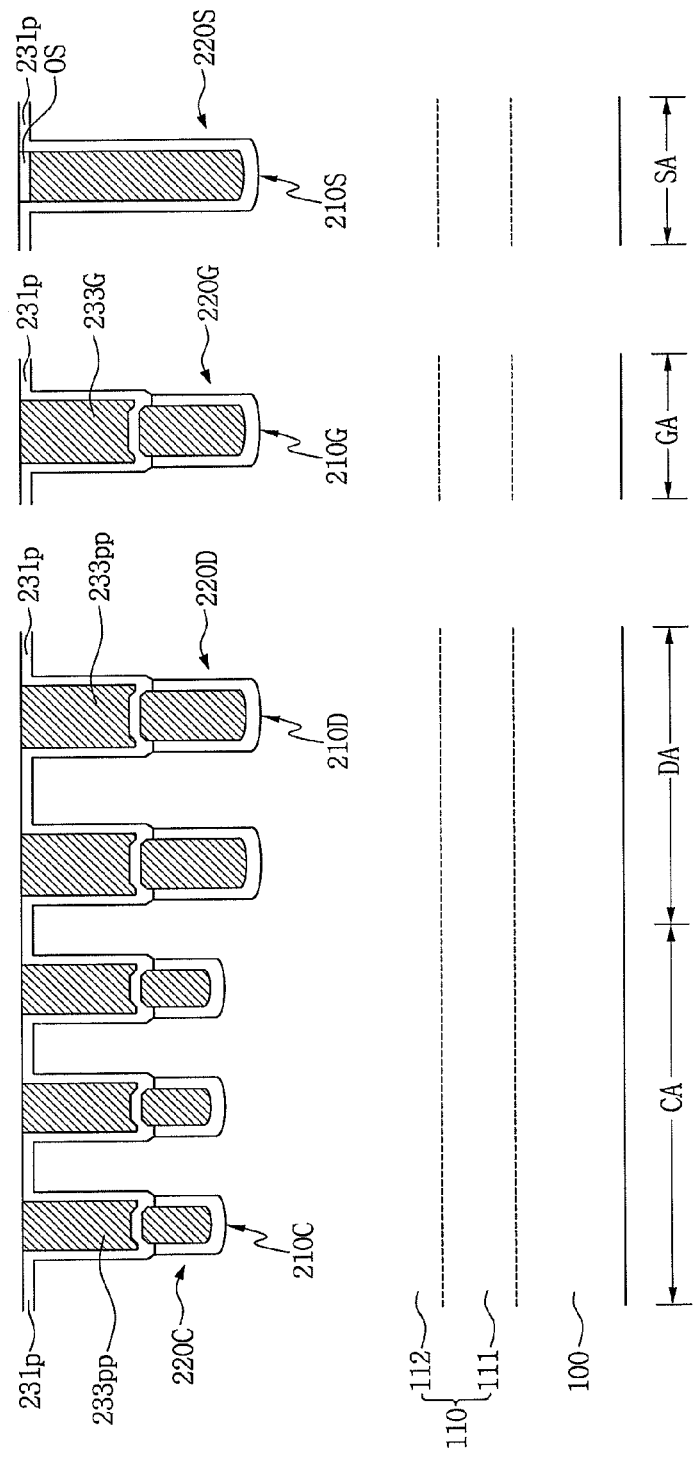

Referring to FIG. 3H, the method may include performing a planarization process to leave a planarized preliminary gate electrode 233pp within the cell trench 210C and the dummy trench 210D and form a gate pickup electrode 233G filling the gate pickup trench 210G. A top surface of the preliminary gate insulating layer 231p disposed on the upper channel layer 112 may be exposed. A top surface of the gate pickup electrode 233G may be co-planar with or at a higher level than the top surface of the upper channel layer 112. Alternatively, the top surface of the gate pickup electrode 233G may be co-planar with the top surface of the preliminary gate insulating layer 231p. In some embodiments, the planarization process may include a CMP process or an etchback process.

Figure 3I:
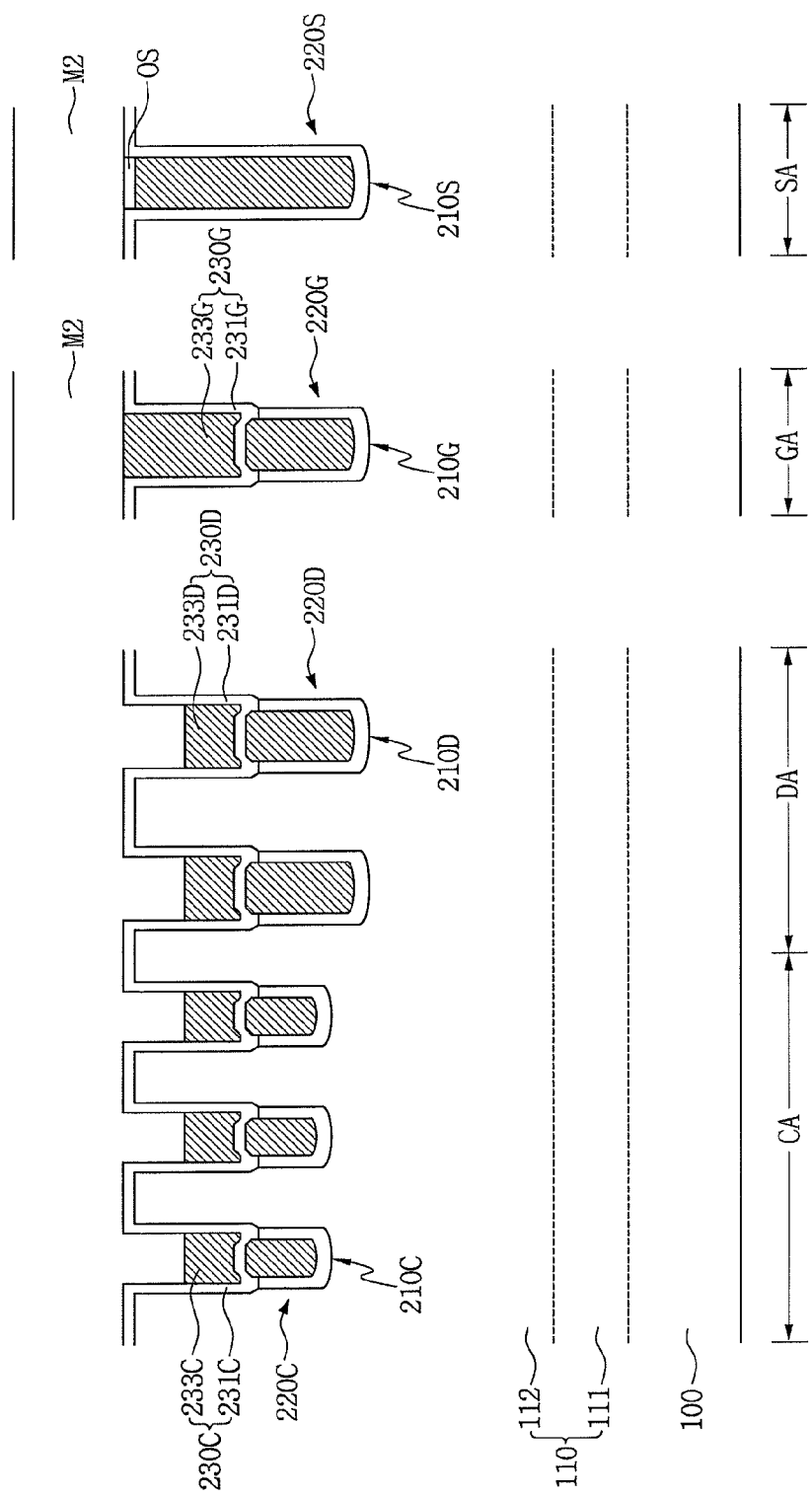

Referring to FIG. 3I, the method may include forming a mask pattern M2 to expose the cell area CA and the dummy area DA and cover the gate pickup area GA and the shield pickup area SA, and recessing the planarized preliminary gate electrode 233p to form cell gate electrodes 233C and dummy gate electrodes 233D. Top surfaces of the gate electrodes 233C and 233D may be respectively disposed in the middle of the trenches 210C and 210D, and a gate insulating layer 231 may be exposed on the inner walls of the trenches 210C and 210D. In some embodiments, the recessing of the planarized preliminary gate electrode 233pp may include an etchback process. Subsequently, the mask pattern M2 may be removed.

During the current process, a cell gate pattern 230C including a cell gate insulating layer 231C and a cell gate electrode 233D, a dummy gate pattern 230D including a dummy gate insulating layer 231D and a dummy gate electrode 233D, and a gate pickup pattern 230G including a gate pickup gate insulating layer 231G and a gate pickup electrode 233G may be formed. The cell gate insulating layer 231C may surround a bottom surface and all side surfaces of the cell gate electrode 233C, the dummy gate insulating layer 231D may surround a bottom surface and all side surfaces of the dummy gate electrode 233D, and the gate pickup insulating layer 231G may surround a bottom surface and all side surfaces of the gate pickup electrode 233G. The gate insulating layers 231C, 231D, and 231G may cover all the inner walls of the trenches 210C, 210D, and 210G and extend onto the surface of the upper channel layer 112. For example, the gate insulating layers 231C, 231D, and 231G may be materially in continuity with one another.

Figure 3J:
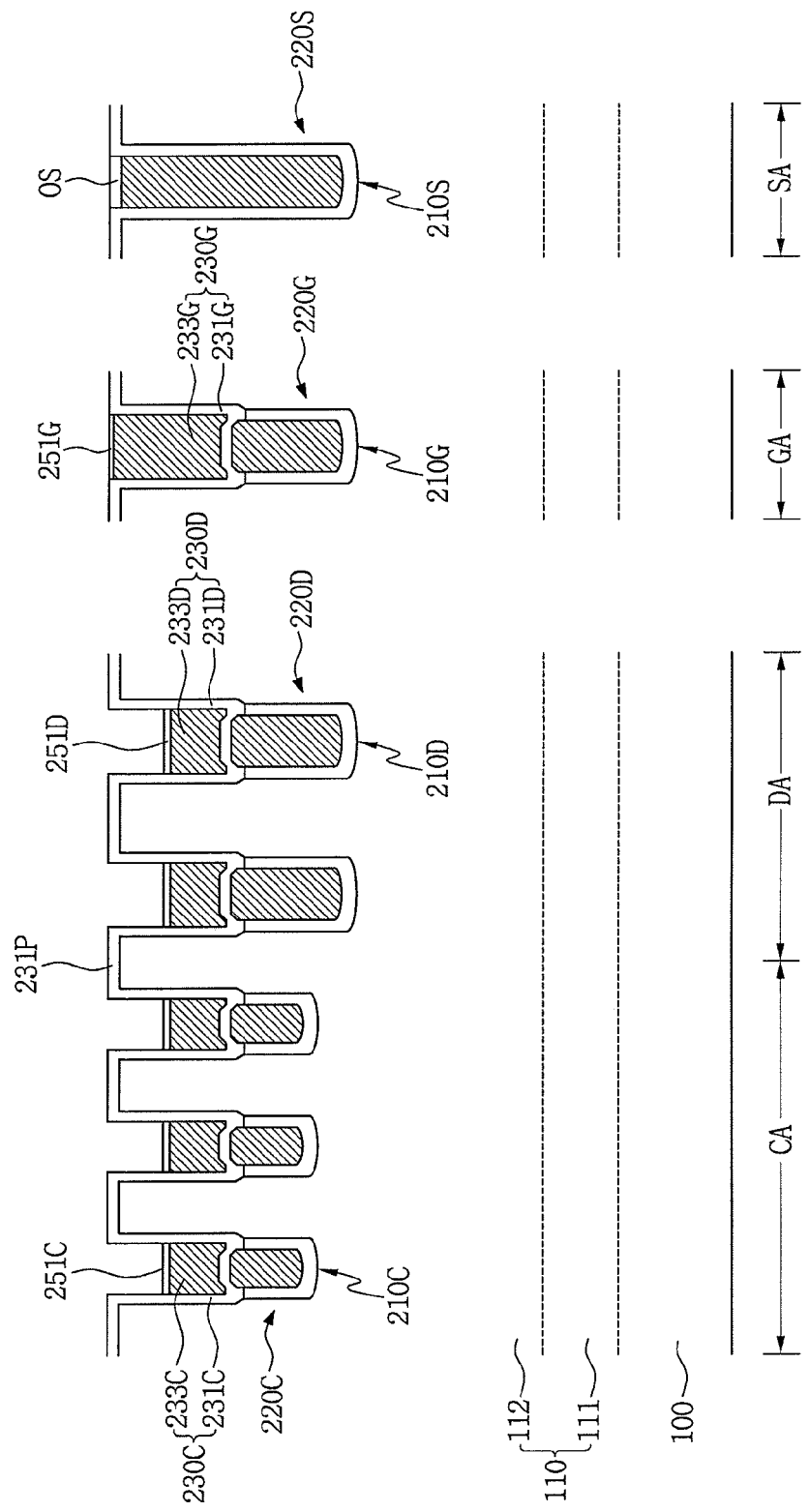

Referring to FIG. 3J, the method may include forming buffer layers 251C, 251D, and 251G on the surfaces of the gate electrodes 233C and 233D and the gate pickup electrode 233G. In some embodiments, the buffer layers 251C, 251D, and 251G may be formed by oxidizing the surfaces of the gate electrodes 233C and 233D and the gate pickup electrode 233G. The buffer layers 251C, 251D, and 251G may include a cell buffer layer 251C, a dummy buffer layer 251D, and a gate pickup buffer layer 251G.

Figure 3K:
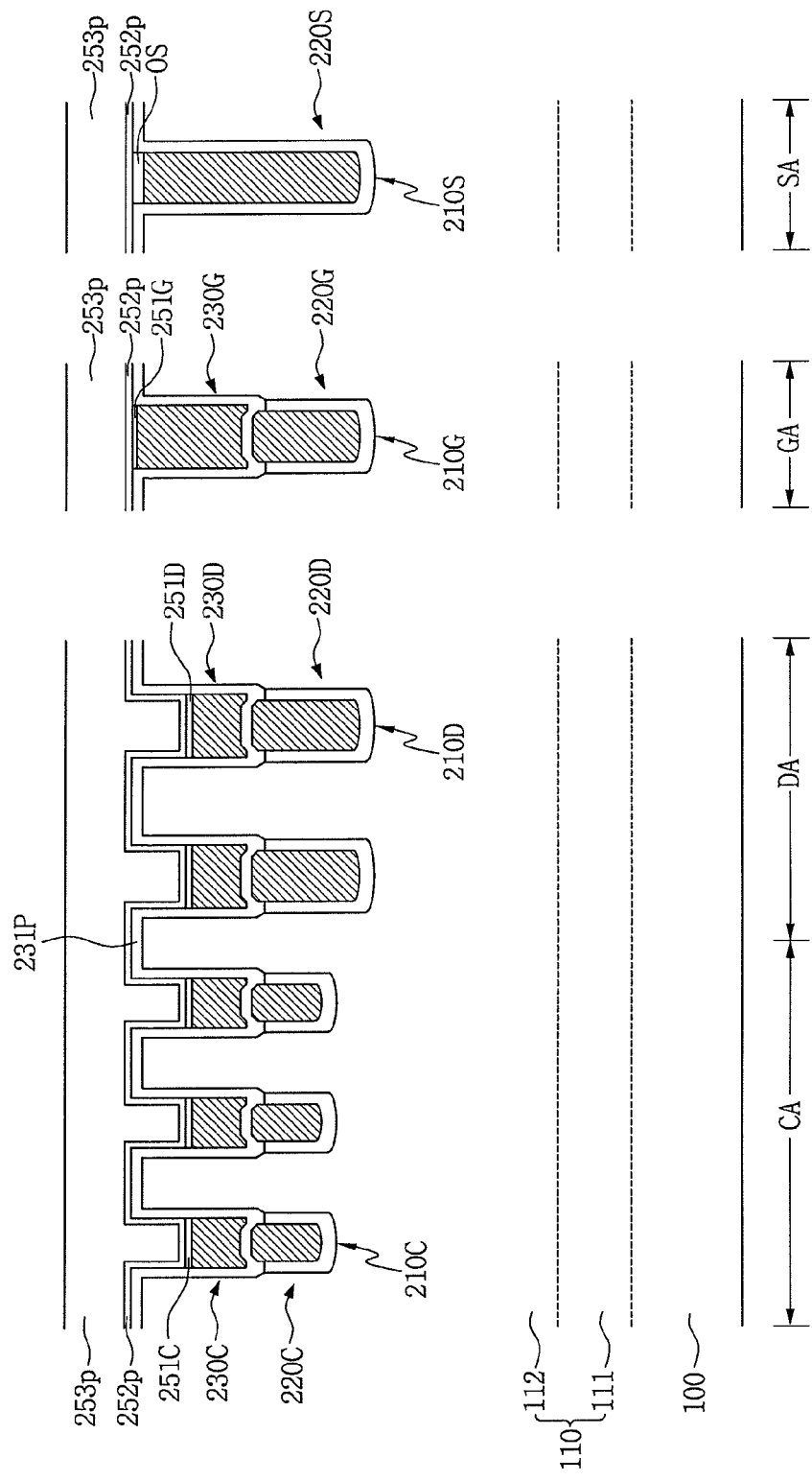

Referring to FIG. 3K, the method may include blanketly forming a preliminary capping stopper layer 252p and a preliminary capping layer 253p on the underlying elements. In some embodiments, the preliminary capping stopper layer 252p may be conformally formed on top surfaces of the buffer layer 251, inner walls of the cell trenches 210C and the dummy trenches 210D, and the gate insulating layer 231 disposed on the upper channel layer 112. In some embodiments, the preliminary capping stopper layer 252p may comprise silicon nitride conformally formed using a CVD process. In some embodiments, the preliminary capping layer 253p may be formed on the preliminary capping stopper layer 252p to fill the trenches 210C and 210D. In some embodiments, the preliminary capping layer 253p may include silicon oxide.

Figure 3L:
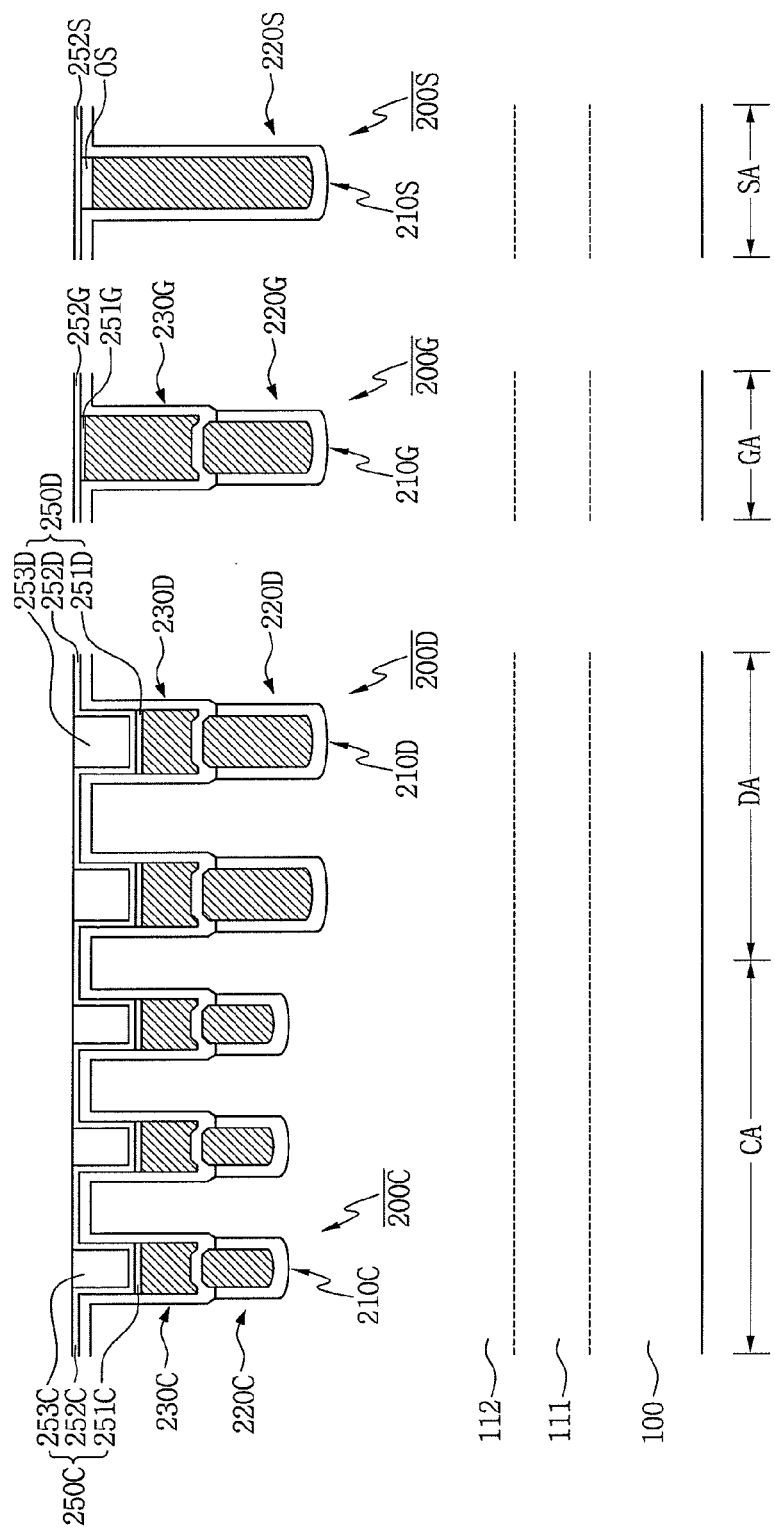

Referring to FIG. 3L, the method may include planarizing the preliminary capping layer 253p to form capping layers 253C and 253D filling the trenches 210C and 210D. The preliminary capping stopper layer 252p may be exposed on the upper channel layer 112. The preliminary capping layer stopper layer 252p may be modified into a cell capping stopper layer 252C, a dummy capping stopper layer 252D, a gate pickup capping stopper layer 252G, and a shield pickup capping stopper layer 252S. A cell capping pattern 250C including a cell buffer layer 251C, a cell capping stopper layer 252C, and a cell capping layer 253C, and a dummy capping pattern 250D including a dummy buffer layer 251D, a dummy capping stopper layer 252D, and a dummy capping layer 253D may be formed. Accordingly, a cell trench pattern 200C including the cell shield pattern 220C, the cell gate pattern 230C, and the cell capping pattern 250C disposed within the cell trench 210C, a dummy trench pattern 200D including the dummy shield pattern 220D, the dummy gate pattern 230D, and the dummy capping pattern 250D disposed within the dummy trench 210D, a gate trench pattern 200G including the gate pickup shield pattern 220G and the gate pickup pattern 230G disposed within the gate pickup trench 210G, and a shield trench pattern 200G including the shield pickup pattern 220G disposed within the shield pickup trench 210S, may be formed.

Figure 3M:
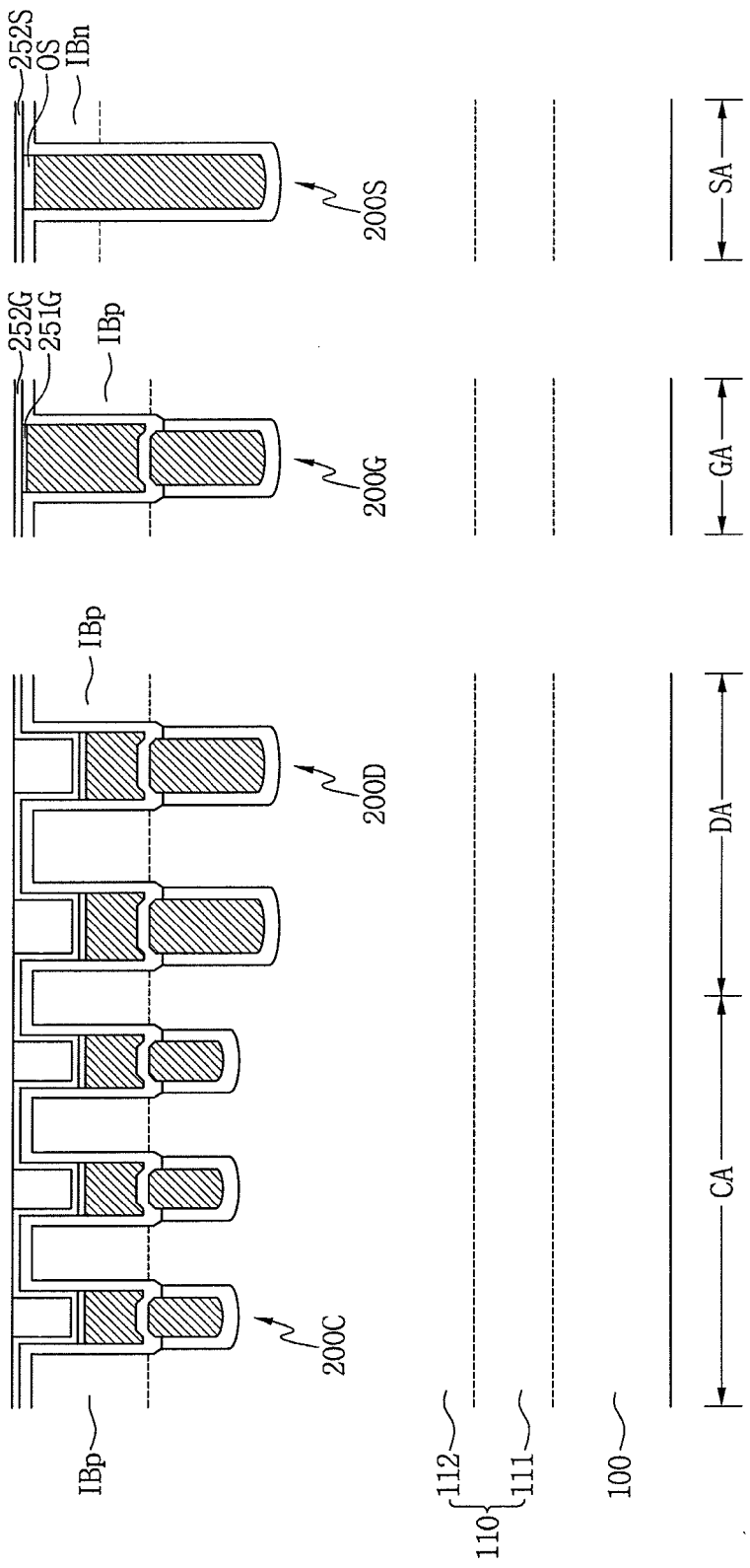
Figure 30:
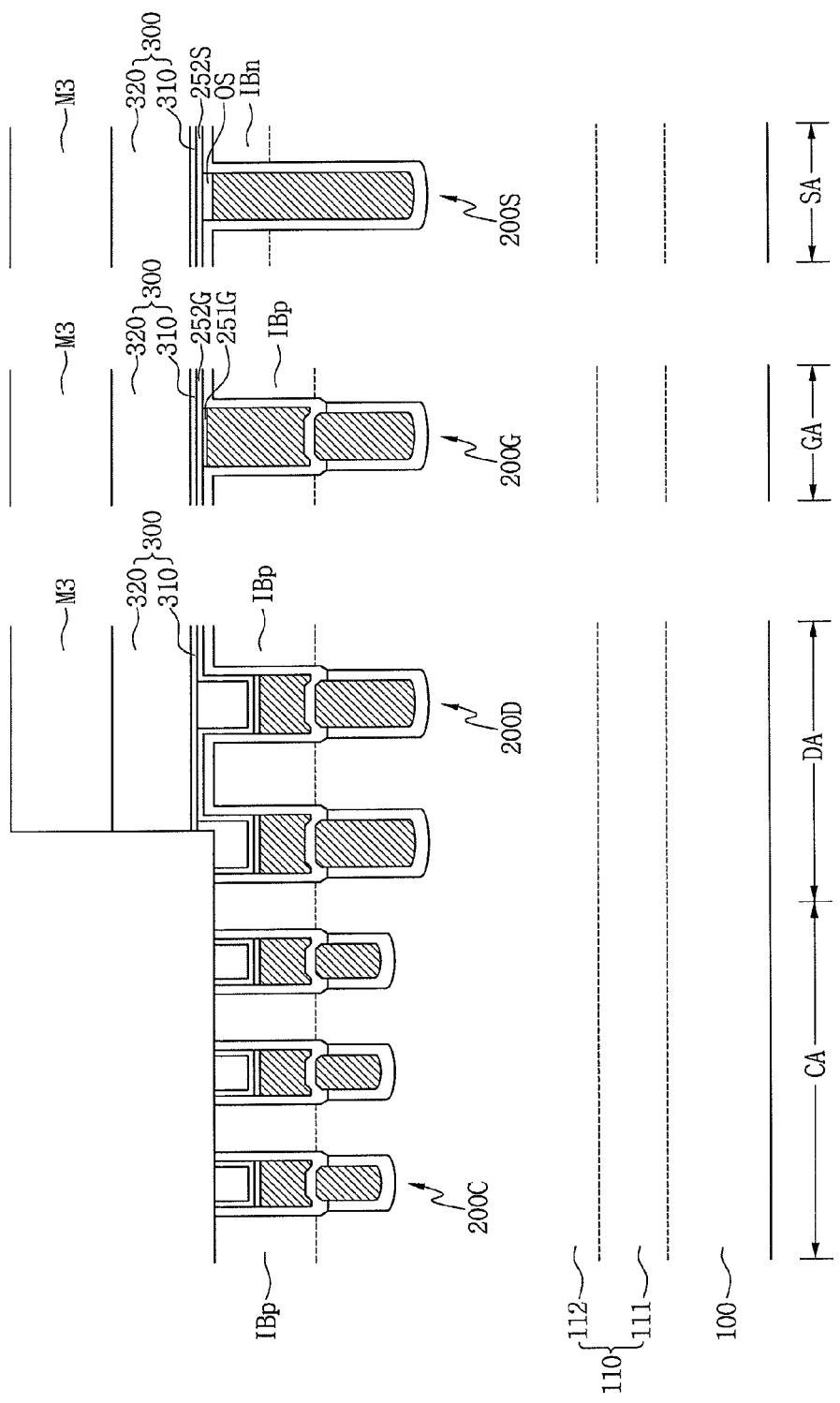

Referring to FIG. 3M, the method may include implanting P-type impurities, such as boron (B), into an upper portion of the upper channel layer 221 disposed in the cell area CA, the dummy area DA, and the gate pickup area GA to form a P-type impurity body IBp, and implanting N-type impurities, such as phosphorus or arsenic (As), into an upper portion of the upper channel layer 112 disposed in the shield pickup area SA to form an N-type impurity body IBn.

Referring to FIG. 3N, the method may include blanketly forming an interlayer insulating layer 300 on the resulting structure. In some embodiments, the interlayer insulating layer 300 may include a lower interlayer insulating layer 310 and an upper interlayer insulating layer 320. In some embodiments, the lower interlayer insulating layer 310 may include silicon nitride formed using a CVD process, while the upper interlayer insulating layer 320 may include silicon oxide formed using a CVD process.

Referring to FIG. 3O, the method may include forming a mask pattern M3 exposing the entire cell area CA and a portion of the dummy area DA, (and) exposing the gate pickup area GA and the shield pickup area SA, removing the interlayer insulating layer 300 and the cell capping stopper layer 252C covering the cell area CA, and partially removing the cell gate insulating layer 221C to expose the upper channel layer 112.

Figure 3P:
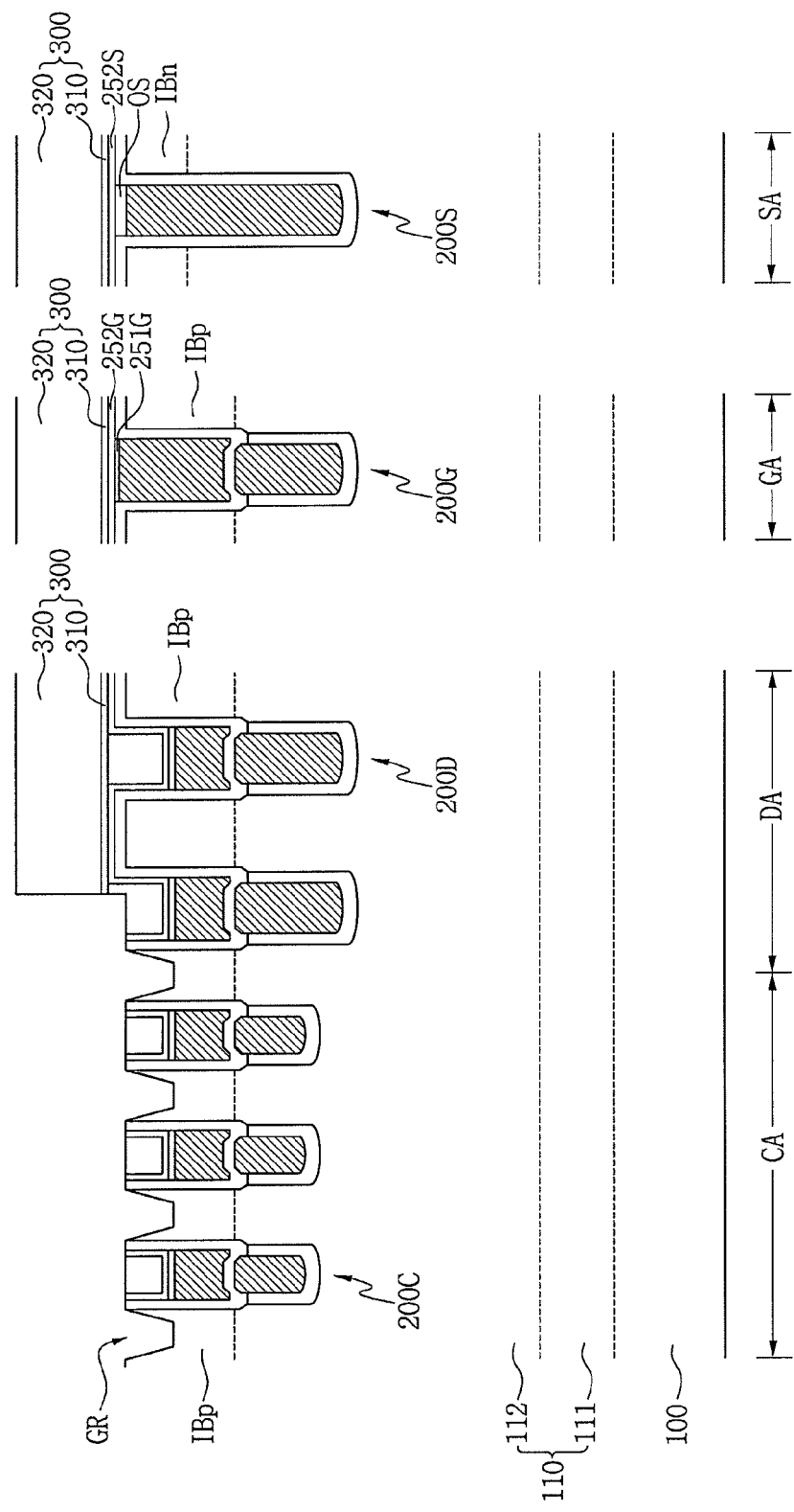

Referring to FIG. 3P, the method may include obliquely etching the upper channel layer 112 exposed in the cell area CA to form grooves GR having inclined sidewalls. The mask pattern M3 may be removed after forming the grooves GR, or removed after subsequent ion implantation processes.

Figure 3Q:
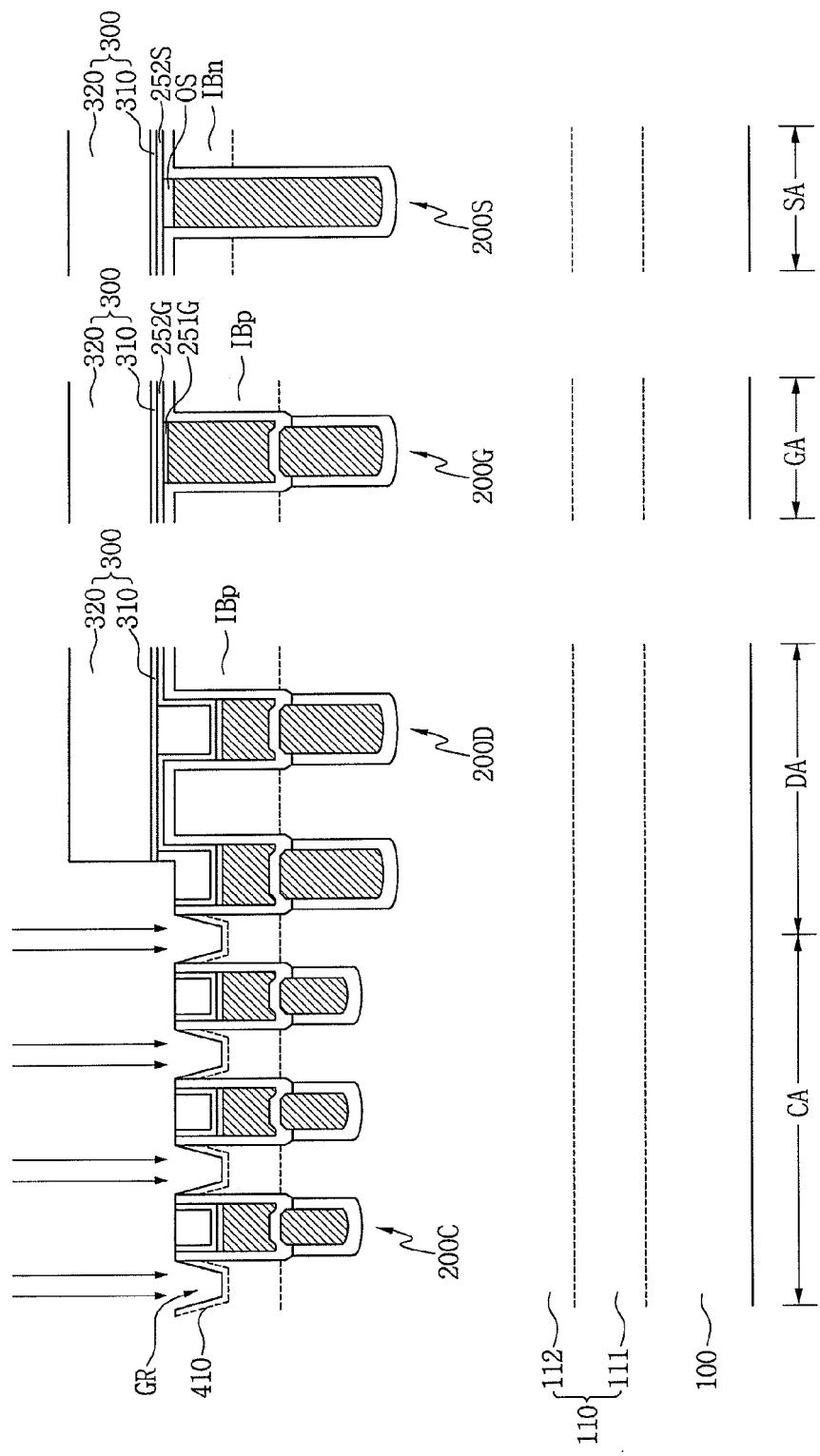

Referring to FIG. 3Q, the method may include implanting P-type impurities under bottom surfaces of the grooves GR to form source isolation regions 410. The source isolation grooves 410 may be formed along profiles of the grooves GR. Since, during this process, the ions are implanted under the bottom surfaces of the grooves GR, the source isolation regions 410 may be finely and elaborately formed using relatively lower energy. Since the source isolation regions 410 have a shallow depth and a relatively small, or thin, thickness, it is possible to very accurately control the position, depth, thickness, and concentration of each source isolation region 410.

Figure 3R:
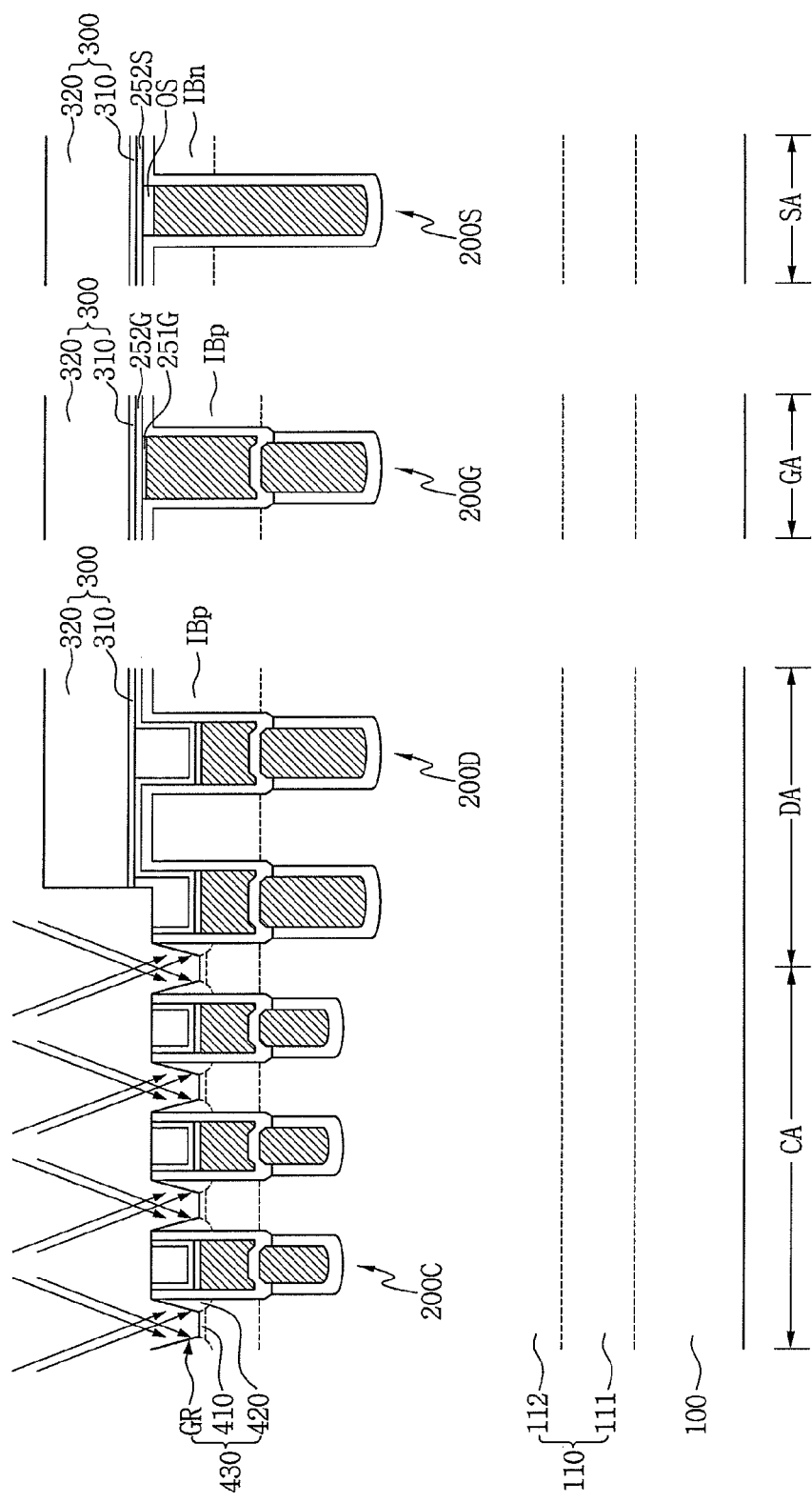

Referring to FIG. 3R, the method may include implanting N-type impurities into both sidewalls of the grooves GR using an oblique ion implantation process to form source regions 420. As a result of the inclined ion implantation process, internal regions of the both sidewalls of the grooves GR may be reversed from a P type into an N type. Subsequently, the mask pattern M3 may be removed. During the current process, source contact regions 430 including the source isolation regions 410 disposed under the bottom surfaces of the grooves GR and the source regions 420 disposed under side surfaces of the grooves GR may be formed. Since the source regions 420 are formed using an oblique etching process, the source regions 420 may be formed in precise positions to have a precise concentration.

Figure 3S:
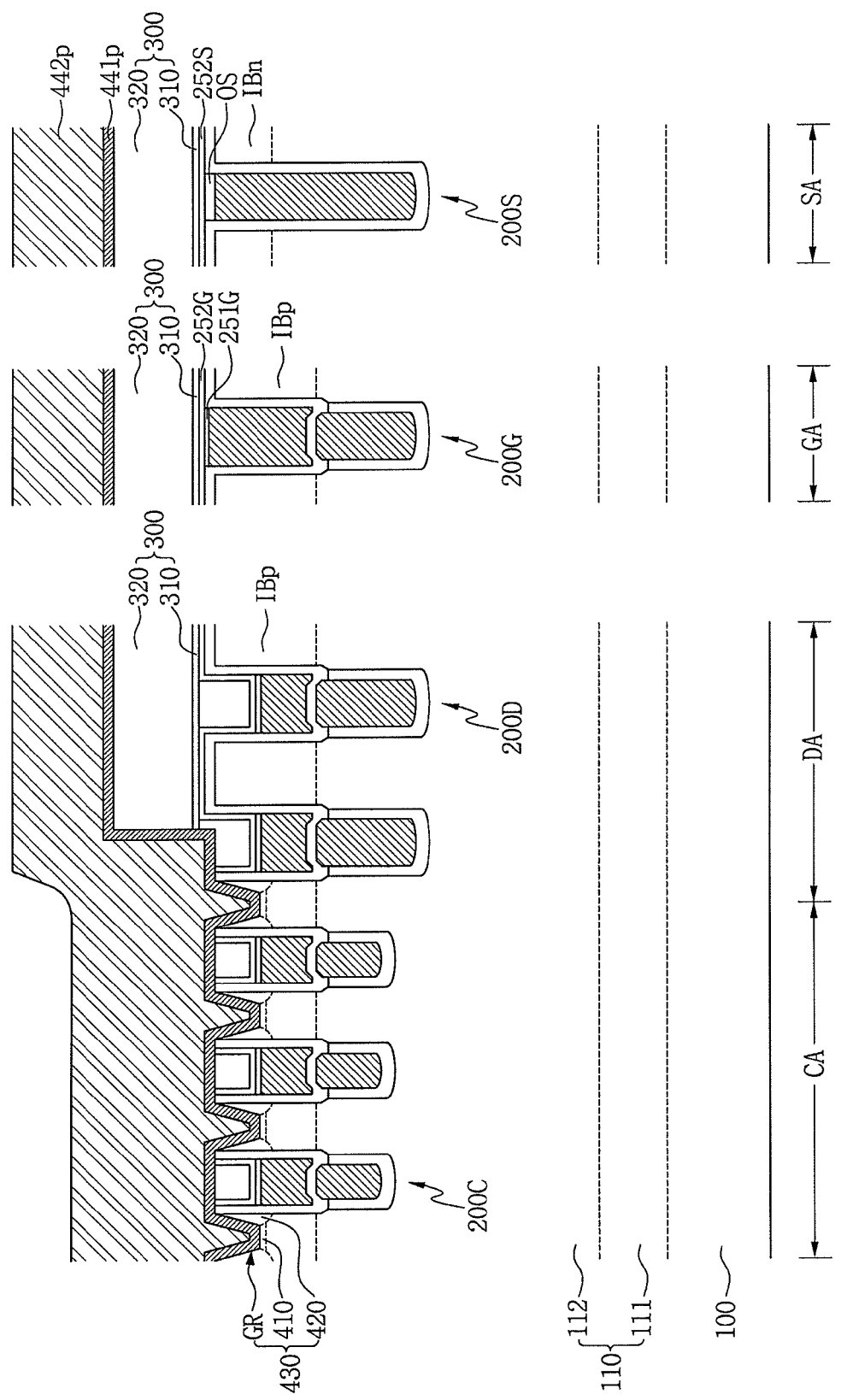

Referring to FIG. 3S, the method may include blanketly forming a preliminary source barrier metal 441p to cover the source contact regions 430, for example, the bottom surfaces and inner walls of the grooves GR, and forming a preliminary source electrode metal 442p on the preliminary source barrier metal 441p to fill the grooves GR. In some embodiments, the source barrier metal 441p may include at least one of Ti, TiN, Ta, TaN, TiW, WN, or other barrier metals. In some embodiments, the preliminary source electrode metal 442p may include a metal or a metal alloy.

Figure 3T:
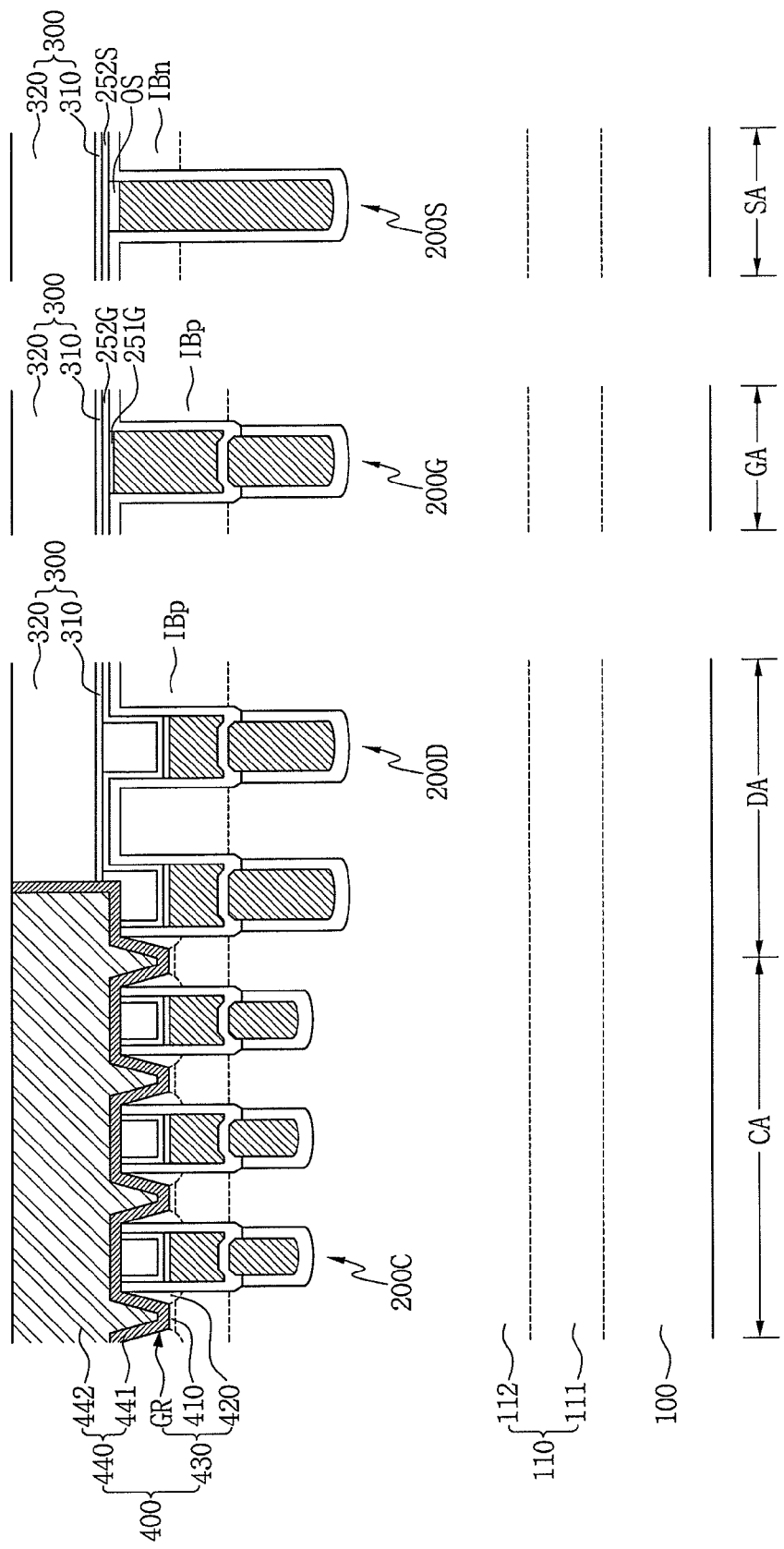

Referring to FIG. 3T, the method may include planarizing the preliminary source electrode metal 442p and the preliminary source barrier metal 441p to form a source electrode pattern 440 including a source electrode metal 442 and a source barrier metal 441. In the dummy area DA, the gate pickup area GA, and the shield pickup area SA, the preliminary source electrode metal 442p and the preliminary source barrier metal 441p disposed on the upper interlayer insulating layer 310 may be removed to expose the upper interlayer insulating layer 310. A source pattern 400 including the source isolation regions 410 disposed under the grooves GR, the source regions disposed on the sides of the grooves GR, and the source electrode pattern 440 filling the grooves GR, may be formed.

Figure 3U:
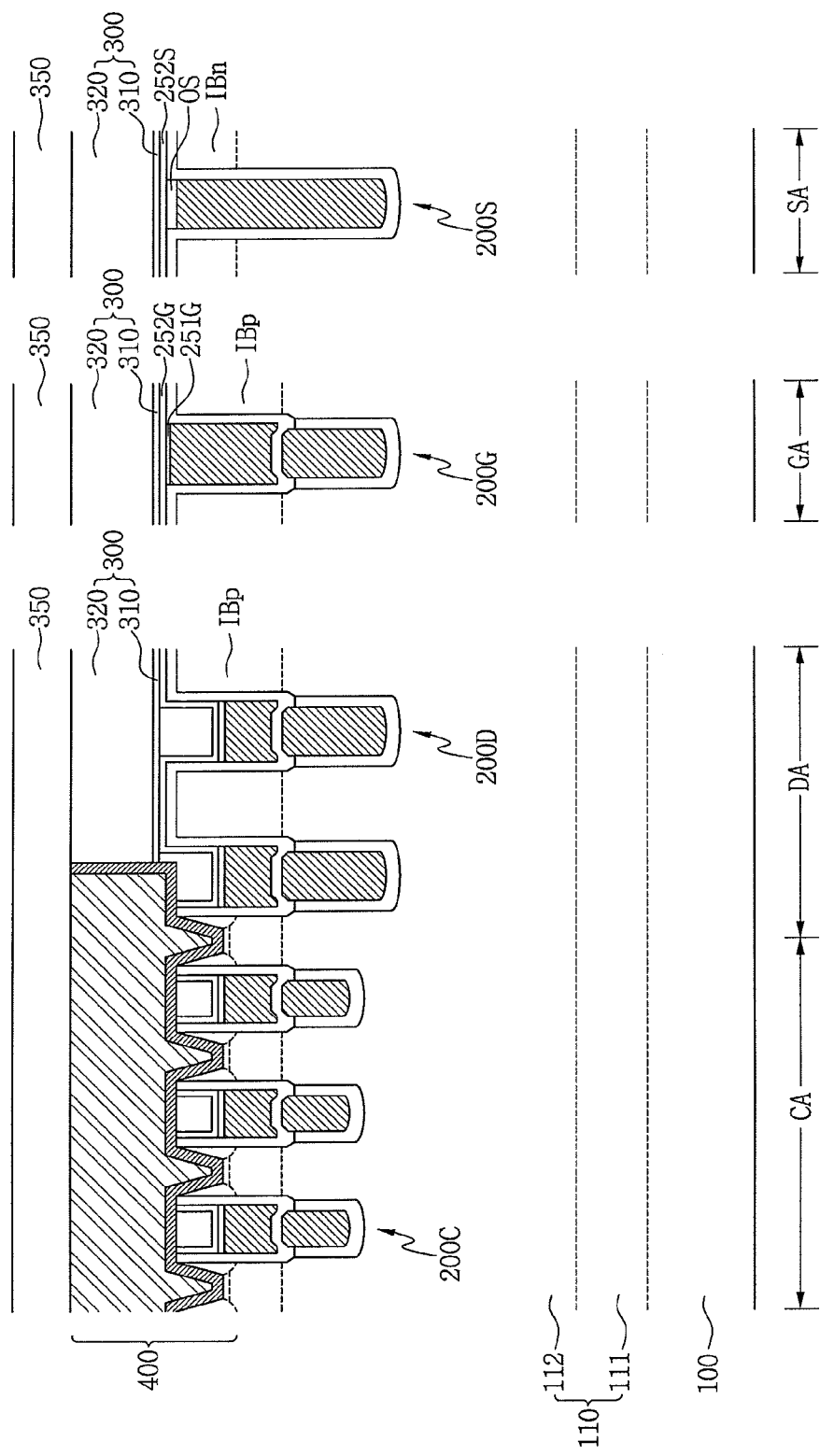

Referring to FIG. 3U, the method may include forming a passivation layer 350 on the source electrode 440. In various embodiments, the passivation layer 350 may include a single insulating layer or a multilayered insulating structure including silicon oxide, silicon nitride, or polyimide.

Figure 3V:
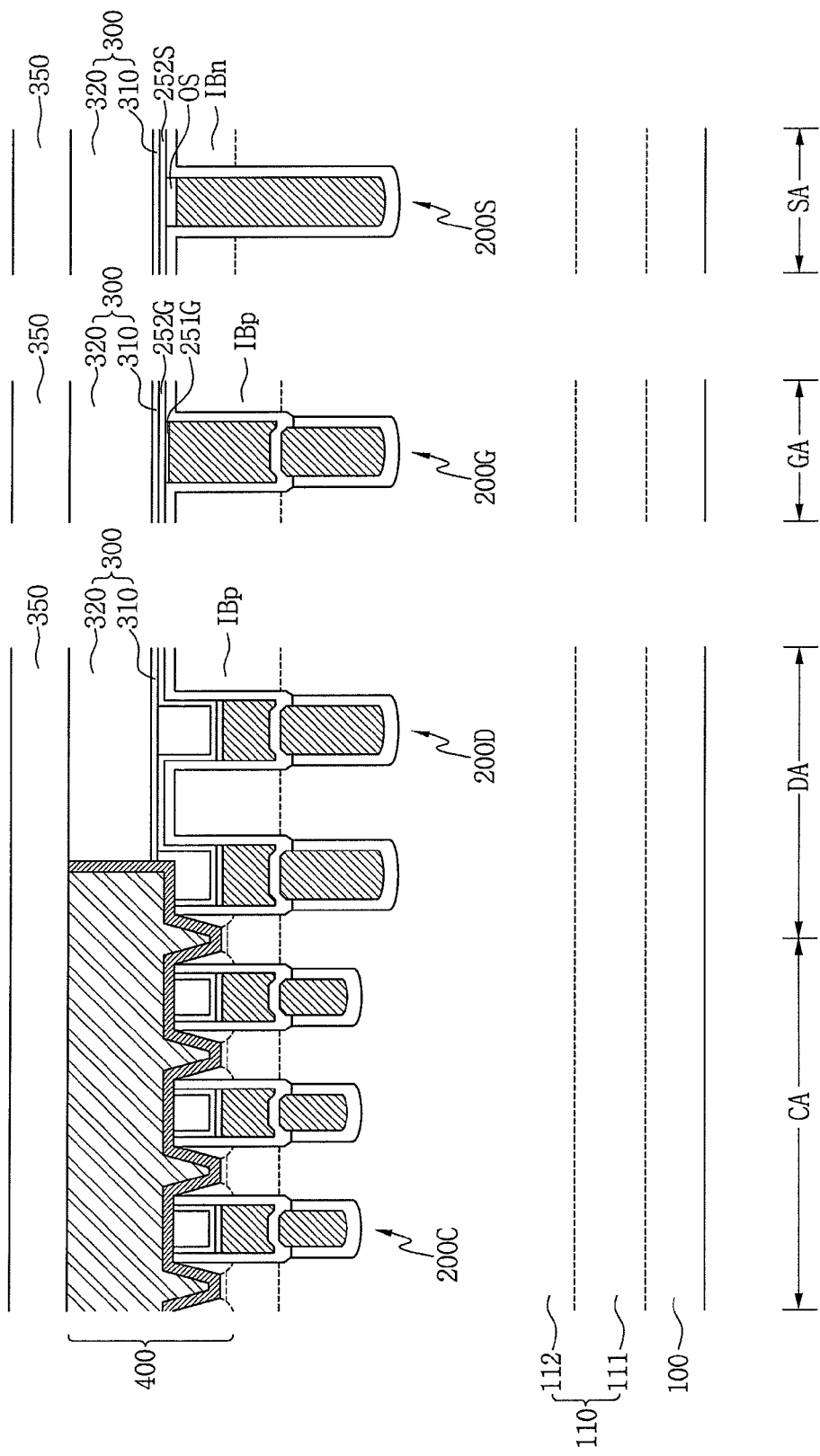

Referring to FIG. 3V, the method may include recessing a bottom surface of the substrate 100 using a grinding process and/or an etchback process to thin out the substrate 100.

Subsequently, the method may include forming a drain electrode 500 on the bottom surface of the substrate 100 with reference to FIGS. 1A through 1E. In some embodiments, the drain electrode 500 may comprise a material including a metal.

Referring to FIG. 4A, in another embodiment, after the process described with reference to FIG. 3A is performed, a method of fabricating a semiconductor device may include forming trenches 210C, 210D, 210G, and 210S in an upper channel layer 112, conformally forming a preliminary shield insulating layer 221p on inner walls of the trenches 210C, 210D, 210G, and 210S and a top surface of the upper channel layer 112, and forming a preliminary shield electrode 223p on the preliminary shield insulating layer 221p to fill the trenches 210C, 210D, 210G, and 210S. The trenches 210C, 210D, 210G, and 210S may include cell trenches 210C disposed in a cell area CA, dummy trenches 210D disposed in a dummy area DA, a gate pickup trench 210G disposed in a gate pickup area GA, and a shield pickup trench 210S disposed in a shield pickup area SA. The dummy trenches 210D, the gate pickup trench 210G, and the shield pickup trench 210S may be formed to have a greater depth and a greater width than the cell trenches 210C. Also, each of the shield pickup trenches 210S may be formed to have a greater upper width and a smaller lower width. In some embodiments, the preliminary shield insulating layer 221p may include silicon oxide formed using an oxidation process, a sub-atmosphere CVD process, or an ALD process. In some embodiments, the preliminary shield electrode 223p may include poly-Si formed using a CVD process.

Figure 4B:
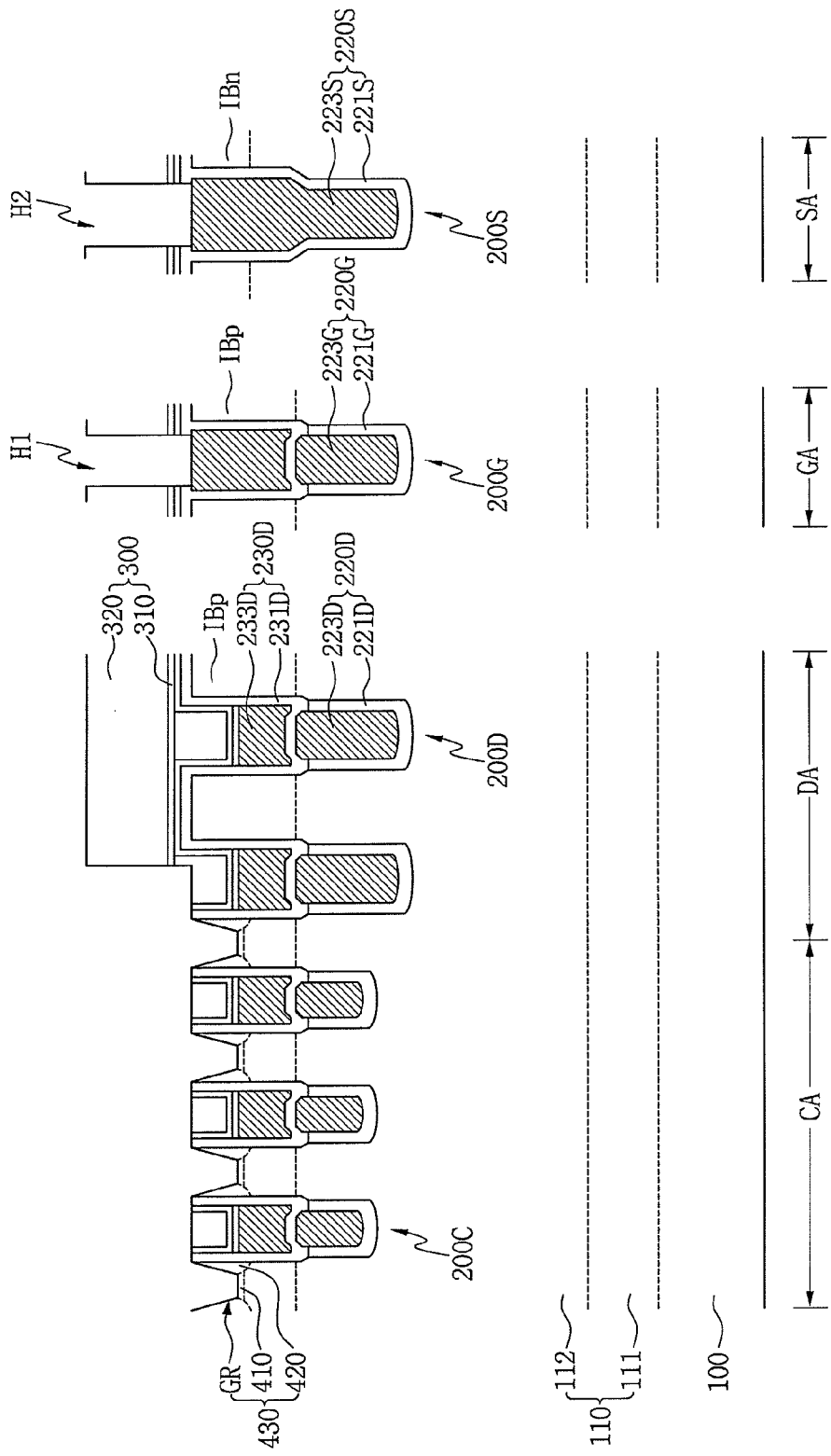

Referring to FIG. 4B, after the processes described with reference to FIGS. 3C through 3R are performed, the method may optionally include forming holes H1 and H2 exposing a gate pickup electrode 233G and a shield pickup electrode 223S.

Figure 4C:
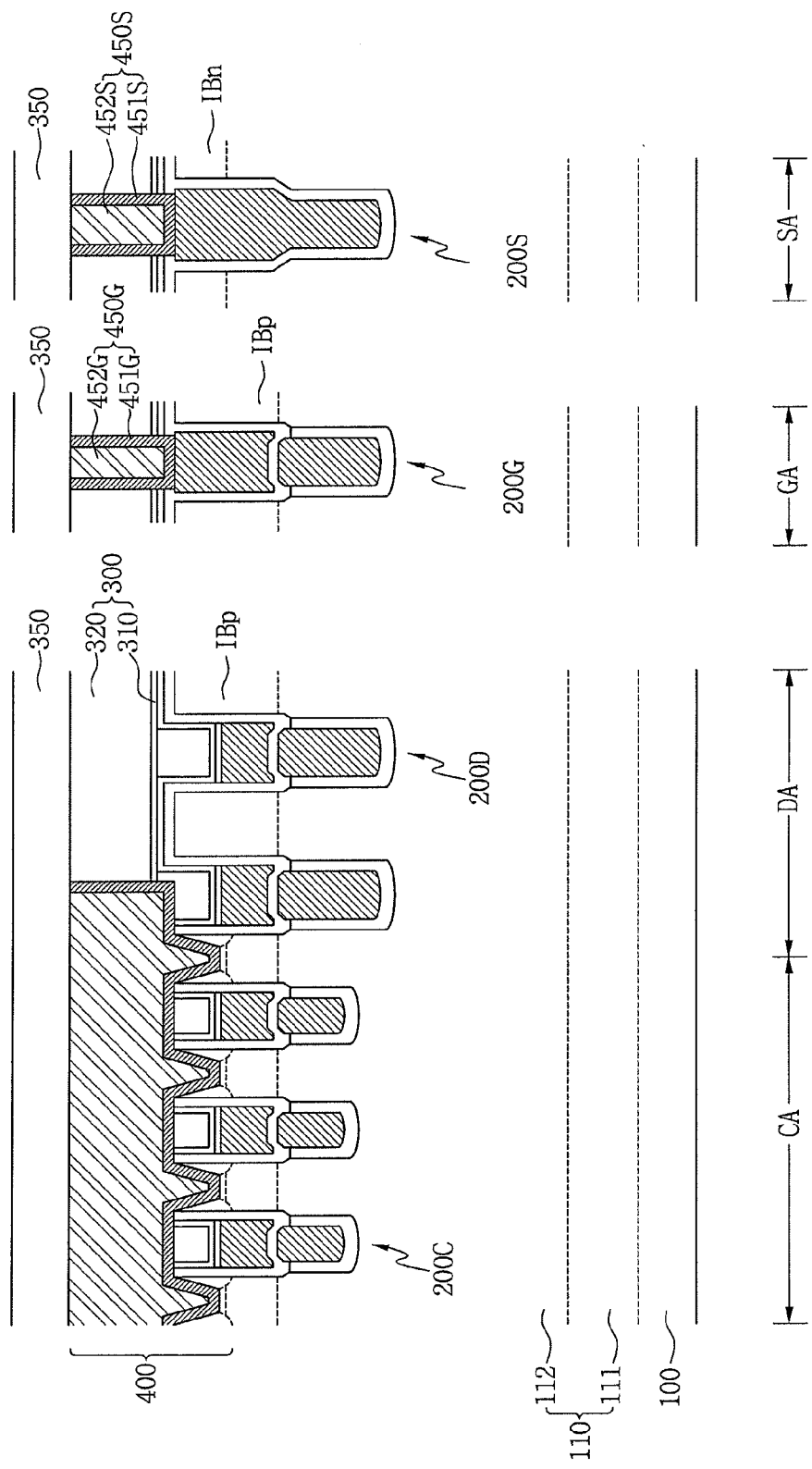

Referring to FIG. 4C, after the processes described with reference to FIGS. 3S through 3V are performed, the method may optionally include forming a gate pickup pattern 450G and a shield pickup pattern 450S, and recessing a bottom surface of a substrate 100. In some embodiments, the gate pickup pattern 450G may include a gate pickup barrier metal 451G and a gate pickup metal 452G, and the shield pickup pattern 450S may include a shield pickup barrier metal 451S and a shield pickup metal 452S.

The method may further optionally include forming a drain electrode 500 on the bottom surface of the substrate 100 with further reference to FIGS. 2A through 2C.

Figure 5A:
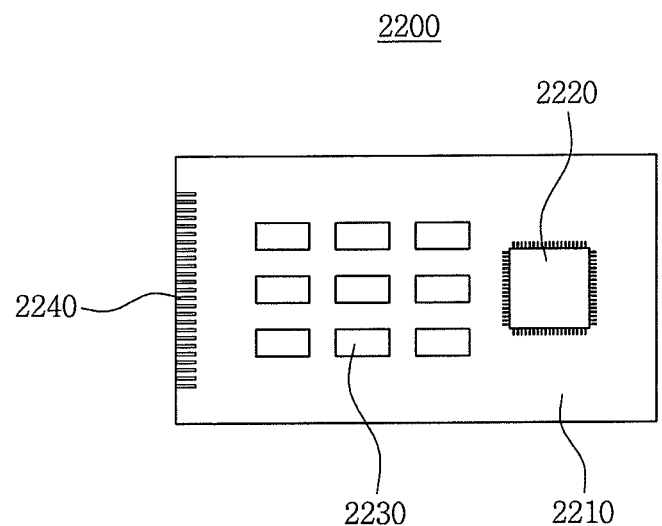
FIGS. 5A through 5D are schematic diagrams of a semiconductor module, electronic systems, and a mobile device including semiconductor devices according to embodiments of the inventive concepts.

Referring to FIG. 5A, a semiconductor module 2200 according to embodiments of the inventive concepts may include a semiconductor device 2230 according to embodiments of the inventive concepts, which may be mounted on a module substrate 2210. The semiconductor module 2200 may further include a microprocessor (MP) 2220 mounted on the module substrate 2210. Input/output (I/O) terminals 2240 may be disposed on at least one side of the module substrate 2210.

Figure 5B:
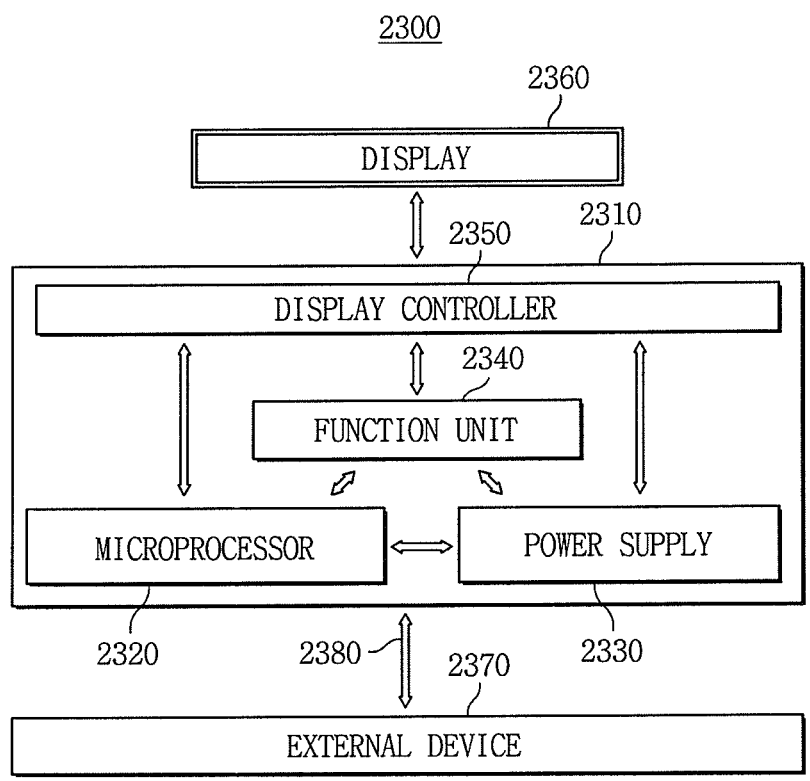

Referring to FIG. 5B, a semiconductor device according to embodiments of the inventive concepts may be applied to an electronic system 2300. The electronic system 2300 may include a body 2310. The body 2310 may include a microprocessor unit (MP) 2320, a power supply 2330, a function unit 2340, and/or a display controller 2350. The body 2310 may be a system board or motherboard having a printed circuit board (PCB). The MP 2320, the power supply 2330, the function unit 2340, and the display controller 2350 may be mounted on the body 2310. A display 2360 may be disposed on a top surface of the body 2310 or outside the body 2310. For example, the display 2360 may be disposed on a surface of the body 2310 and display an image processed by the display controller 2350. The power supply 2330 may receive a predetermined voltage from an external power source, divide the predetermined voltage into various voltage levels, and transmit the divided voltages to the MP 2320, the function unit 2340, and the display controller 2350. The MP 2320 may receive a voltage from the power supply 2330 and control the function unit 2340 and the display 2360. The function unit 2340 may implement various functions of the electronic system 2300. For instance, when the electronic system 2300 is a mobile electronic product, such as a portable phone, the function unit 2340 may include several elements capable of wireless communication functions, such as output of an image to the display 2360 or output of a voice to a speaker, by dialing or communication with an external device 2370. When the function unit 2340 includes a camera, the function unit 2340 may serve as an image processor. In other embodiments, when the electronic system 2300 is connected to a memory card to increase capacity, the function unit 2340 may be a memory card controller. The function unit 2340 may exchange signals with the external device 2370 through a wired or wireless communication unit 2380. In addition, when the electronic system 2300 requires a universal serial bus (USB) to expand functions thereof, the function unit 2340 may serve as an interface controller. The semiconductor devices 10A and 10B described in various embodiments of the inventive concepts may be included in at least one of the MP 2320 and the function unit 2340.

Figure 5C:
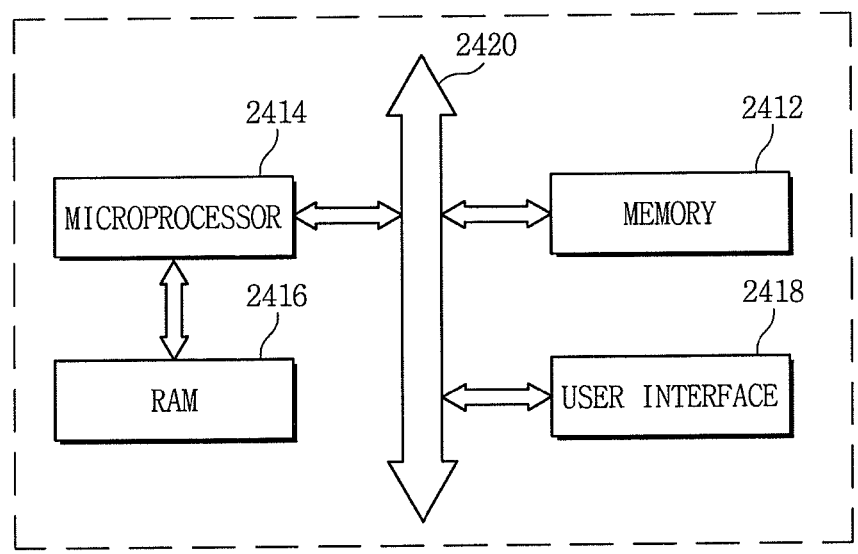

Referring to FIG. 5C, an electronic system 2400 may include a semiconductor device according to embodiments of the inventive concepts. The electronic system 2400 may be used to fabricate a mobile device or computer. For example, the electronic system 2400 may include a memory system 2412, an MP 2414, a random access memory (RAM) 2416, and a user interface 2418 configured to communicate data using a bus 2420. The MP 2414 may program and control the electronic system 2400. The RAM 2416 may be used as an operation memory of the MP 2414. For instance, the MP 2414 or the RAM 2416 may include at least one of semiconductor devices according to embodiments of the inventive concepts. The MP 2414, the RAM 2416, and/or other elements may be assembled within a single package. The user interface 2418 may be used to input data to the electronic system 2400, or output data from the electronic system 2400. The memory system 2412 may store codes for operating the MP 2414, data processed by the MP 2414, or external input data. The memory system 2412 may include a controller and a memory.

Figure 5D:
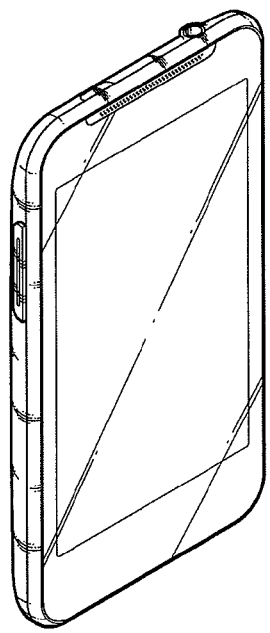

FIG. 5D is a schematic diagram of a mobile device 2500 including a semiconductor device according to embodiments of the inventive concepts. The mobile device 2500 may be interpreted as a mobile phone or a tablet personal computer (PC). Furthermore, a semiconductor device according to embodiments of the inventive concepts may be used not only for a tablet PC but also for a portable computer such as a laptop computer, an MPEG-1 audio layer 3 (MP3) player, an MP4 player, a navigation device, a solid-state disk (SSD), a desktop computer, or electronic devices for automotive and household uses.

Semiconductor devices according to various embodiments of the inventive concepts are suitable for enhanced switching performance.

Semiconductor devices according to embodiments of the inventive concepts can have relatively low contact resistance because the contact area between the source electrode and the source region can be increased.

Semiconductor devices according to embodiments of the inventive concepts are configured such that an electrical short-circuit phenomenon between source regions can be reliably prevented.

Semiconductor devices according to embodiments of the inventive concepts can have improved power efficiency.

Effects of the various embodiments are further mentioned throughout the specification.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concepts as defined in the claims.

What is claimed is:

1. A method of fabricating a semiconductor device, comprising:
   forming a channel layer on a substrate;
   forming trench patterns in the channel layer;
   forming impurity bodies in the channel layer between the trench patterns;
   forming grooves in the impurity bodies formed in the channel layer;
   forming source isolation regions in the impurity bodies at bottom portions of the grooves; and
   forming source regions in the impurity bodies at sidewall portions of the grooves,
   wherein the source isolation regions directly contact the source regions on either side of the sidewall portions of the grooves;
   wherein the forming of the trench patterns comprises forming cell trench patterns, and
   the forming of the cell trench patterns comprises:
      forming cell trenches in the channel layer;
      forming cell shield patterns in lower portions of the cell trenches;
      forming cell gate patterns on the cell shield patterns positioned within the cell trenches; and
      forming cell capping patterns on the cell gate patterns positioned within the cell trenches;
   wherein the forming of the cell shield patterns comprises:
      conformally forming a preliminary cell shield insulating layer on inner walls of the cell trenches;
      forming a preliminary cell shield electrode on the preliminary cell shield insulating layer to fill the cell trenches;
      recessing the preliminary cell shield electrode to form a cell shield electrode having a top surface disposed in the middle region of the cell trench; and
      recessing the preliminary cell shield insulating layer to form a cell shield insulating layer to expose upper portions of the inner walls of the cell trenches and having a top surface disposed at a lower level than the top surface of the cell shield electrode;
   wherein the forming of the cell gate patterns comprises:
      forming a cell gate insulating layer on the top surface of the cell shield electrode and the inner walls of the cell trenches;
      forming a preliminary cell gate electrode on the cell gate insulating layer to fill the cell trenches; and
      recessing the preliminary cell gate electrode to form a cell gate electrode having a top surface disposed in the middle of the cell trench; and
   wherein the forming of the cell capping pattern comprises:
      forming a cell buffer layer on the top surface of the cell gate electrode;
      forming a cell capping stopper layer on the cell buffer layer and the inner walls of the cell trenches;
      forming a preliminary cell capping layer on the cell capping stopper layer to fill the cell trenches; and
      planarizing the preliminary cell capping layer to a cell capping layer, so that the cell capping layer remains only within the cell trenches.

2. The method of claim 1, wherein the forming of the channel layer comprises:
   forming a lower channel layer on the substrate using an epitaxial growth process, and forming an upper channel layer on the lower channel layer using an epitaxial growth process,
   wherein the substrate comprises phosphorus (P) at a first concentration, the lower channel layer comprises arsenic (As) at a second concentration lower than the first concentration, and the upper channel layer comprises phosphorus at a third concentration lower than the first concentration and higher than the second concentration.

3. The method of claim 1, wherein the forming of the trench patterns further comprises forming a shield pickup trench pattern, and
   the forming of the shield pickup trench patterns comprises:
      forming a shield pickup trench in the channel layer to have a greater width and a greater depth than the cell trench,
      forming a shield pickup insulating layer on an inner wall of the shield pickup trench; and
      forming a shield pickup electrode on the shield pickup insulating layer to fill the shield pickup trench,
      wherein a top surface of the shield pickup electrode is co-planar with, or at a higher level than, a top surface of the channel layer.

4. The method of claim 1, wherein:
   the cell capping stopper layer includes silicon nitride,
   the cell capping layer includes silicon oxide, and
   a top surface of the cell capping layer is co-planar with, or at a higher level than, the top surface of the channel layer.

5. The method of claim 1, wherein each of the cell gate patterns has a greater horizontal width than each of the cell shield patterns.

6. The method of claim 1, wherein sidewall portions of the grooves are inclined,
   the forming of the source isolation regions comprises implanting P-type impurities along profiles of the bottom portions and sidewall portions of the grooves, and
   the forming of the source regions comprises obliquely implanting N-type impurities under the sidewall portions of the grooves to inverse the source isolation regions disposed under the sidewall portions of the grooves from a P type to an N type.

7. The method of claim 1, further comprising:
   conformally forming a preliminary barrier metal on the bottom and sidewall portions of the grooves;
   forming a preliminary source electrode metal on the preliminary barrier metal to fill the grooves; and
   planarizing the preliminary source electrode metal.

8. A method of fabricating a semiconductor device, comprising:
   forming a channel layer on a substrate;

forming trench patterns in the channel layer;
forming impurity bodies in the channel layer between the trench patterns;
forming grooves in the impurity bodies formed in the channel layer;
after forming the grooves, implanting impurities in the impurity bodies exposed by the grooves to form source isolation regions in the impurity bodies at bottom portions of the grooves; and
after forming the source isolation regions, implanting impurities in the impurity bodies exposed by the grooves to form source regions in the impurity bodies at sidewall portions of the grooves.

9. The method of claim 8, wherein the forming of the channel layer comprises:
forming a lower channel layer on the substrate using an epitaxial growth process, and forming an upper channel layer on the lower channel layer using an epitaxial growth process,
wherein the substrate comprises phosphorus (P) at a first concentration, the lower channel layer comprises arsenic (As) at a second concentration lower than the first concentration, and the upper channel layer comprises phosphorus at a third concentration lower than the first concentration and higher than the second concentration.

10. The method of claim 8, wherein the forming of the trench patterns comprises forming cell trench patterns, and
the forming of the cell trench patterns comprises:
forming cell trenches in the channel layer;
forming cell shield patterns in lower portions of the cell trenches;
forming cell gate patterns on the cell shield patterns positioned within the cell trenches; and
forming cell capping patterns on the cell gate patterns positioned within the cell trenches.

11. The method of claim 10, wherein the forming of the trench patterns further comprises forming a gate pickup trench pattern, and
the forming of the gate trench patterns comprises:
forming a gate pickup trench in the channel layer to have a greater width and a greater depth than the cell trench,
forming a gate pickup shield pattern in a lower portion of the gate pickup trench; and
forming a gate pickup pattern on the gate pickup shield pattern disposed in the gate pickup trench,
wherein a top surface of the gate pickup pattern is co-planar with, or at a higher level than, a top surface of the channel layer.

12. The method of claim 11, wherein the forming of the gate pickup shield pattern comprises:
conformally forming a preliminary gate pickup shield insulating layer on inner walls of the gate pickup trenches;
forming a preliminary gate pickup shield electrode on the preliminary gate pickup shield insulating layer to fill the gate pickup trenches;
recessing the preliminary gate pickup shield electrode to form a gate pickup shield electrode having a top surface disposed in a middle region of the gate pickup trench; and
recessing the preliminary gate pickup shield insulating layer to form a gate pickup shield insulating layer exposing upper portions of the inner walls of the gate pickup trenches and having a top surface disposed at a lower level than the top surface of the gate pickup shield electrode.

13. The method of claim 12, wherein the forming of the gate pickup pattern comprises:
forming a gate pickup insulating layer on the top surface of the gate pickup shield electrode and the inner walls of the gate pickup trenches;
forming a preliminary gate pickup electrode on the gate pickup insulating layer to fill the gate pickup trench; and
recessing the preliminary gate pickup electrode to form a gate pickup electrode having a top surface disposed in the middle of the gate pickup trench.

14. The method of claim 10, wherein the forming of the trench patterns further comprises forming a shield pickup trench pattern, and
the forming of the shield pickup trench patterns comprises:
forming a shield pickup trench in the channel layer to have a greater width and a greater depth than the cell trench,
forming a shield pickup insulating layer on an inner wall of the shield pickup trench; and
forming a shield pickup electrode on the shield pickup insulating layer to fill the shield pickup trench,
wherein a top surface of the shield pickup electrode is co-planar with, or at a higher level than, a top surface of the channel layer.

15. The method of claim 10, wherein the forming of the cell shield patterns comprises:
conformally forming a preliminary cell shield insulating layer on inner walls of the cell trenches;
forming a preliminary cell shield electrode on the preliminary cell shield insulating layer to fill the cell trenches;
recessing the preliminary cell shield electrode to form a cell shield electrode having a top surface disposed in the middle region of the cell trench; and
recessing the preliminary cell shield insulating layer to form a cell shield insulating layer to expose upper portions of the inner walls of the cell trenches and having a top surface disposed at a lower level than the top surface of the cell shield electrode.

16. The method of claim 15, wherein the forming of the cell gate patterns comprises:
forming a cell gate insulating layer on the top surface of the cell shield electrode and the inner walls of the cell trenches;
forming a preliminary cell gate electrode on the cell gate insulating layer to fill the cell trenches; and
recessing the preliminary cell gate electrode to form a cell gate electrode having a top surface disposed in the middle of the cell trench.

17. The method of claim 16, wherein the forming of the cell capping pattern comprises:
forming a cell buffer layer on the top surface of the cell gate electrode;
forming a cell capping stopper layer on the cell buffer layer and the inner walls of the cell trenches;
forming a preliminary cell capping layer on the cell capping stopper layer to fill the cell trenches; and
planarizing the preliminary cell capping layer to form a cell capping layer, so that the cell capping layer remains only within the cell trenches.

18. The method of claim 10, wherein each of the cell gate patterns has a greater horizontal width than each of the cell shield patterns.

19. The method of claim 8, wherein sidewall portions of the grooves are inclined, the forming of the source isolation regions comprises implanting P-type impurities along profiles of the bottom portions and sidewall portions of the grooves, and the forming of the source regions comprises obliquely implanting N-type impurities under the sidewall portions of the grooves to inverse the source isolation regions disposed under the sidewall portions of the grooves from a P type to an N type.

20. The method of claim 8, further comprising:

conformally forming a preliminary barrier metal on the bottom and sidewall portions of the grooves;

forming a preliminary source electrode metal on the preliminary barrier metal to fill the grooves; and planarizing the preliminary source electrode metal.

* * * * *